(12) United States Patent
Kaneko et al.

(10) Patent No.: US 9,799,538 B2
(45) Date of Patent: Oct. 24, 2017

(54) SUBSTRATE CLEANING SYSTEM

(71) Applicant: TOKYO ELECTRON LIMITED, Minato-ku (JP)

(72) Inventors: Miyako Kaneko, Nirasaki (JP); Takehiko Orii, Nirasaki (JP); Itaru Kanno, Minato-ku (JP)

(73) Assignee: TOKYO ELECTRON LIMITED, Minato-ku (JP)

( * ) Notice: Subject to any disclaimer, the term of this patent is extended or adjusted under 35 U.S.C. 154(b) by 386 days.

(21) Appl. No.: 14/025,218

(22) Filed: Sep. 12, 2013

(65) Prior Publication Data
US 2014/0144465 A1   May 29, 2014

(30) Foreign Application Priority Data

Nov. 26, 2012   (JP) ................................. 2012-257080
Apr. 30, 2013   (JP) ................................. 2013-095997

(51) Int. Cl.
*H01L 21/67*   (2006.01)
*H01L 21/687*  (2006.01)

(52) U.S. Cl.
CPC .... *H01L 21/67051* (2013.01); *H01L 21/6708* (2013.01); *H01L 21/6715* (2013.01); *H01L 21/67109* (2013.01); *H01L 21/68728* (2013.01); *H01L 21/68792* (2013.01)

(58) Field of Classification Search
CPC .......... H01L 21/6708; H01L 21/67109; H01L 21/6715; H01L 21/68728; H01L 21/68792; H01L 21/0209; H01L 21/67051
USPC .......................................................... 134/94.1
See application file for complete search history.

(56) References Cited

U.S. PATENT DOCUMENTS

| | | | | |
|---|---|---|---|---|
| 6,207,231 B1 * | 3/2001 | Tateyama | ................ | B05C 11/08 118/315 |
| 7,458,762 B2 * | 12/2008 | Han | ................... | H01L 21/67098 414/781 |
| 8,023,099 B2 | 9/2011 | Yamamoto | | |
| 2007/0266935 A1 * | 11/2007 | Lee | ................... | H01L 21/67288 118/52 |
| 2011/0048468 A1 * | 3/2011 | Amano | ............. | H01L 21/67051 134/32 |

(Continued)

FOREIGN PATENT DOCUMENTS

| | | | |
|---|---|---|---|
| JP | 62-193248 A | 8/1987 |
| JP | 02-246332 A | 10/1990 |
| JP | 07-074137 A | 3/1995 |

(Continued)

*Primary Examiner* — Katelyn Whatley
(74) *Attorney, Agent, or Firm* — Oblon, McClelland, Maier & Neustadt, L.L.P.

(57) ABSTRACT

A substrate cleaning system has a first processing apparatus including a first holding device for holding a substrate, and a treatment solution supply device for supplying onto the entire portion of the front surface of the substrate a treatment solution which includes a volatile component and solidifies or is cured to form a treatment film, and a second processing apparatus including a second holding device for holding the substrate, and a removal-solution supply device for supplying onto the substrate a removal solution which removes the treatment film formed on the front surface of the substrate after the treatment solution supplied by the treatment solution supply device solidifies or is cured.

12 Claims, 17 Drawing Sheets

(56) References Cited

U.S. PATENT DOCUMENTS

2013/0092191 A1* 4/2013 Saio ................ H01L 21/02057
134/18

FOREIGN PATENT DOCUMENTS

| | | | |
|---|---|---|---|
| JP | 08-318181 | | 12/1996 |
| JP | 11162816 A | * | 6/1999 |
| JP | 2003-282518 A | | 10/2003 |
| JP | 2007-258462 | | 10/2007 |
| JP | 2008-060368 | | 3/2008 |
| JP | 2008060368 A | * | 3/2008 |
| JP | 2009-170554 A | | 7/2009 |
| JP | 2010186901 A | * | 8/2010 |
| JP | 2012-174775 A | | 9/2012 |
| JP | 2012-227318 A | | 11/2012 |
| TW | 200729327 A | | 8/2007 |
| TW | 201040666 A | | 11/2010 |
| TW | 201224682 A | | 6/2012 |
| WO | WO 2012002145 A1 * | 1/2012 | ....... H01L 21/02057 |

* cited by examiner

SUBSTRATE CLEANING SYSTEM

CROSS-REFERENCE TO RELATED APPLICATIONS

The present application is based upon and claims the benefit of priority to Japanese Patent Application Nos. 2012-257080, filed Nov. 26, 2012 and 2013-095997, filed Apr. 30, 2013, the entire contents of each of which are incorporated herein by reference.

BACKGROUND OF THE INVENTION

Field of the Invention

The present invention relates to a substrate cleaning system, a substrate cleaning method and a memory medium.

Description of Background Art

As for a substrate cleaning apparatus to remove particles attached to substrates such as silicon wafers and compound semiconductor wafers, there is a type which removes particles by physical force generated when a flowing substance such as liquid or gas is supplied onto substrate surfaces (see Japanese Patent Publication No. H08-318181). Also, there is a type in which a chemical solution such as SC1 is supplied onto substrate surfaces so that particles are removed through chemical reactions (such as etching) of the supplied solution (see Japanese Patent Publication No. 2007-258462). The entire contents of these applications are incorporated herein by reference.

SUMMARY OF THE INVENTION

According to one aspect of the present invention, a substrate cleaning system has a first processing apparatus including a first holding device for holding a substrate, and a treatment solution supply device for supplying onto the entire portion of the front surface of the substrate a treatment solution which includes a volatile component and solidifies or is cured to form a treatment film, and a second processing apparatus including a second holding device for holding the substrate, and a removal-solution supply device for supplying onto the substrate a removal solution which removes the treatment film formed on the front surface of the substrate after the treatment solution supplied by the treatment solution supply device solidifies or is cured.

According to another aspect of the present invention, a substrate cleaning method includes holding a substrate with a first holding device for holding a substrate, supplying on the entire portion of the front surface of the substrate held by the first holding device a treatment solution which includes a volatile component and solidifies or is cured to form a treatment film, holding the substrate having the treatment solution supplied on the front surface with a second holding device for holding the substrate, and supplying to the substrate a removal solution which removes the treatment film formed on the substrate held by the second holding device.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
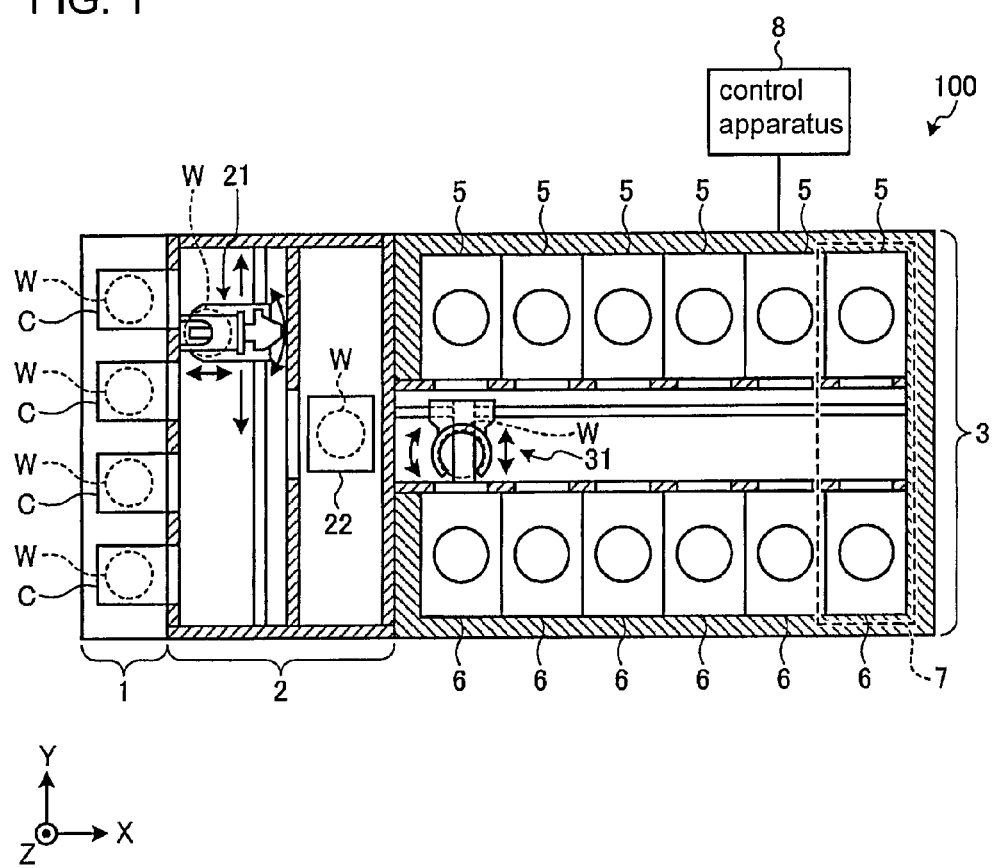
FIG. 1 is a view schematically showing the structure of a substrate cleaning system according to a first embodiment.

The embodiments will now be described with reference to the accompanying drawings, wherein like reference numerals designate corresponding or identical elements throughout the various drawings.

First Embodiment

Structure of Substrate Cleaning System

The schematic structure of a substrate cleaning system according to a first embodiment is described with reference to FIG. 1. FIG. 1 schematically shows the structure of a substrate cleaning system of the first embodiment.

In the following, to clarify positional relationships, axes (X, Y, Z) orthogonal to each other are determined, and a positive Z direction is set to be perpendicular upward to the XY plane. In addition, a negative X direction is set toward the front of a substrate cleaning system, and a positive X direction is set toward the rear of the substrate cleaning system in the following.

As shown in FIG. 1, substrate cleaning system 100 has loading/unloading station 1, transfer station 2 and processing station 3. Loading/unloading station 1, transfer station 2 and processing station 3 are set in position from the front toward the rear of substrate cleaning system 100 in the order of loading/unloading station 1, transfer station 2 and processing station 3.

Loading/unloading station 1 is where carriers (C) are provided to horizontally accommodate multiple (25, for example) wafers (W). For example, four carriers (C) are provided side by side while being positioned immediately adjacent to the front wall of transfer station 2.

Transfer station 2 is positioned in the rear of loading/unloading station 1, and has substrate transfer device 21 and substrate delivery table 22. In transfer station 2, substrate transfer device 21 transfers wafer (W) between carrier (C) in loading/unloading station 1 and substrate delivery table 22.

Processing station 3 is positioned in the rear of transfer station 2. In processing station 3, substrate transfer device 31 is provided in the central section.

Substrate cleaning apparatus 7 is positioned in processing station 3. Substrate cleaning apparatus 7 has first processing apparatus 5 and second processing apparatus 6 which is structured to be different from first processing apparatus 5.

First processing apparatus 5 and second processing apparatus 6 are positioned on their respective sides of substrate transfer device 31. A total of six pairs of first processing apparatus 5 and second processing apparatus 6 are provided in processing station 3 in a direction of front to rear. Positioning first processing apparatuses 5 and second processing apparatuses 6 is not limited to that shown in the drawing.

In processing station 3, substrate transfer device 31 transfers one wafer (W) at a time to and from substrate delivery table 22 of transfer station 2, first processing apparatus 5 and second processing apparatus 6. Substrate cleaning treatment is conducted on one wafer (W) at a time in first processing apparatus 5 and second processing apparatus 6 in substrate cleaning apparatus 7.

Substrate cleaning system 100 has control apparatus 8. Control apparatus 8 controls operations in substrate cleaning system 100. Control apparatus 8 is a computer, for example, and has a control section and a memory section, which are not shown in the drawings. The memory section stores programs to control various processes such as a substrate cleaning process. The control apparatus controls operations in substrate cleaning system 100 by reading and executing the program stored in the memory section.

Such a program may also be stored in a memory medium readable by a computer, and installed from the memory medium into the memory section of control apparatus 8. Memory media readable by a computer are a hard disc (HD), flexible disc (FD), compact disc (CD), magneto-optical disc (MO), memory card and the like.

For simplicity purposes, FIG. 1 shows an example in which control apparatus 8 is positioned outside substrate cleaning system 100. However, control apparatus 8 may also be provided inside substrate cleaning system 100. For example, it is an option to accommodate control apparatus 8 in a space above first processing apparatus 5 or above second processing apparatus 6.

In substrate cleaning system 100 structured as above, substrate transfer device 21 of transfer station 2 picks up one wafer (W) from carrier (C) positioned in loading/unloading station 1 and places the picked-up wafer (W) onto substrate delivery table 22. Wafer (W) on substrate delivery table 22 is transferred by substrate transfer device 31 of processing station 3, and is loaded into first processing apparatus 5 and then loaded into second processing apparatus 6. Details of the substrate cleaning treatment conducted in first processing apparatus 5 and second processing apparatus 6 are described later.

Wafer (W) cleaned in first processing apparatus 5 and second processing apparatus 6 is unloaded by substrate transfer device 31 from second processing apparatus 6 and placed again onto substrate delivery table 22. Then, treated wafer (W) on substrate delivery table 22 is returned to carrier (C) by substrate transfer device 21.

In a conventional substrate cleaning apparatus, particles are removed using physical force or using chemical reactions of chemical solutions. However, when conventional techniques are employed, problems may arise; for example, patterns formed on the main surface of a wafer may collapse because of physical force, or the base film of a wafer may be eroded by etching or the like.

Instead of using conventional techniques, substrate cleaning apparatus 7 according to the first embodiment uses change in the volume of a treatment solution for particle removal so that particles attached to wafer (W) are removed, and pattern collapse or base film erosion is suppressed.

Substrate Cleaning Method

Figure 2A:
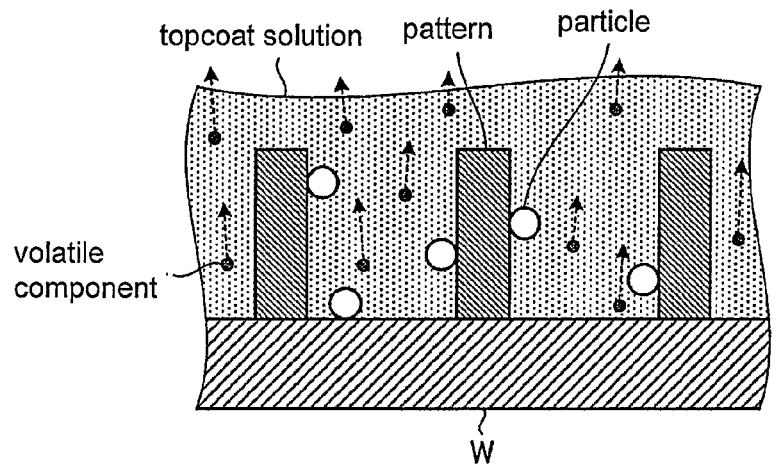
FIG. 2A is a view illustrating a substrate cleaning method.
Figure 2B:
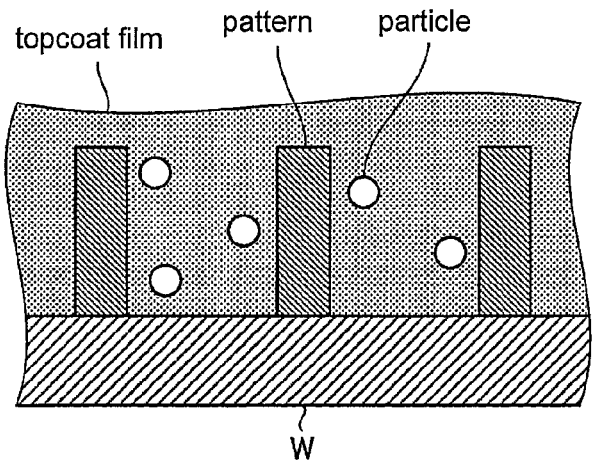
FIG. 2B is a view illustrating a substrate cleaning method.
Figure 2C:
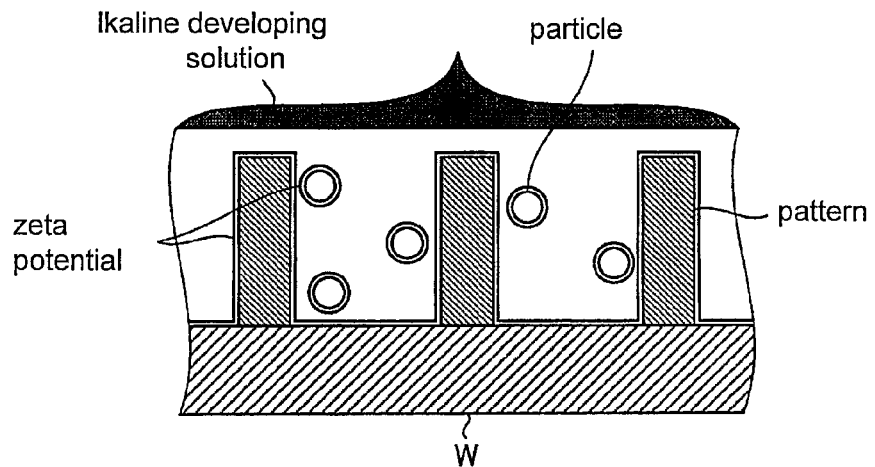
FIG. 2C is a view illustrating a substrate cleaning method.

A substrate cleaning method performed by substrate cleaning apparatus 7 of the first embodiment is described in detail with reference to FIG. 2A~FIG. 2C. FIGS. 2A~2C are views to describe the substrate cleaning method. In the following, a surface where circuits are formed on wafer (W) is referred to as a "main surface" and the surface opposite the main surface as a "lower surface."

As shown in FIG. 2A, a treatment solution that contains a volatile component and forms a film on the entire main surface of wafer (W) (hereinafter referred to as a "film-forming treatment solution") is used in the first embodiment. In particular, a film-forming treatment solution to form a topcoat film on wafer (W) (hereinafter referred to as a "topcoat solution") is used. Here, a topcoat film is a protective film applied on a surface of a resist film to prevent the infiltration of an immersion solution into the resist film. An immersion solution is used for exposure in immersion lithography, for example.

As shown in FIG. 2A, substrate cleaning apparatus 7 supplies a topcoat solution on wafer (W). The topcoat solution supplied on wafer (W) contracts its volume when the volatile component contained in the solution is vaporized. Moreover, since the topcoat solution contains acrylic resin characterized by volume contraction when it is hardened or cured, the volume of the topcoat solution also contracts because of curing contraction of the acrylic resin. Here, "hardened" means the resin solidifies, and "cured" means molecules are bonded to be polymers (for example, cross linking or polymerization).

The topcoat solution solidifies or cures as its volume contracts, and forms a topcoat film. During that time, because of strain caused by the volume contraction of the topcoat solution (tensile force), particles attached to patterns or the like are removed from the patterns or the like (see FIG. 2B).

Because of volume contraction that occurs in a topcoat solution through vaporization of the volatile component and curing contraction of acrylic resin, the volume contraction rate is greater than that of film-forming treatment solutions that contain only a volatile component. Thus, particles are removed by stronger force. Especially, since acrylic resin shows greater curing contraction than other resins such as epoxy resin, containing acrylic resin is effective to provide tensile force to be exerted on the particles.

Substrate cleaning apparatus 7 supplies a removal solution capable of dissolving the topcoat film so that the topcoat film is dissolved and removed from wafer (W). Accordingly, particles are removed along with the topcoat film from wafer (W).

A topcoat film swells when it is dissolved by a removal solution. Thus, according to the substrate cleaning method of the first embodiment, in addition to the volume contraction due to vaporization of the topcoat film, volume expansion caused by swelling of the topcoat film also works on particles to remove the particles from patterns or the like by stronger force.

In the first embodiment, particles are removed using the change in volume of a film-forming treatment solution. Compared with conventional methods for removing particles using physical force, since particles are removed by weaker force according to the present embodiment, pattern collapse is suppressed. In addition, since particles are removed without using chemical reactions, erosion of base film due to etching or the like is also suppressed. Therefore, according to the substrate cleaning method of the first embodiment, particles attached to wafer (W) are removed, and pattern collapse or base film erosion is suppressed. The entire topcoat film formed on wafer (W) is removed without exposure to light for pattern forming.

According to the substrate cleaning method of the first embodiment, it is easier to remove small-diameter particles and particles that have penetrated into spaces between patterns, which are difficult to remove by substrate cleaning methods using physical force.

In the first embodiment, an alkaline removal solution is used to enhance the efficiency of removing particles. In particular, an alkaline developing solution is used as a removal solution. Alkaline developing solutions are not limited to any specific type, as long as they contain at least one of ammonium, tetramethyl ammonium hydroxide (TMAH) and choline-based solutions.

When an alkaline developing solution is supplied, surfaces of wafer (W) and patterns are charged with zeta potential of the same polarity (here, it is negative) as that on surfaces of particles as shown in FIG. 2C. The particles removed from wafer (W) and the like due to a change in volume of the topcoat solution will repel wafer (W) and the like when the particles are charged with zeta potential of the same polarity as that on wafer (W) and the like. Accordingly, the particles are prevented from reattaching to wafer (W) and the like.

After particles are removed from wafer (W) and the like using volume contraction of a topcoat solution, an alkaline developing solution is supplied so that the topcoat film is dissolved, while wafer (W) and the like are charged with zeta potential of the same polarity as that on particles. Accordingly, reattachment of particles is prevented, and the efficiency of removing particles is further enhanced.

In the above, using volume contraction of a topcoat solution has been described as a method for removing particles. However, as long as strain (tensile force) is generated by a change in the volume of a treatment solution, methods for removing particles are not limited to using volume contraction. Namely, if the volume of a resin contained in a topcoat solution swells when the resin solidifies or cures, the volume of the topcoat solution also swells as the resin solidifies or cures. Accordingly, the strain (tensile force) caused by such swelling can be used to remove particles.

The film-forming solution such as a topcoat solution supplied to wafer (W) ultimately will be entirely removed from wafer (W). Therefore, after cleaning is completed, wafer (W) retains the initial state it had before the topcoat solution was applied; specifically, the surface where circuits are formed is exposed.

Structure and Operation of Substrate Cleaning Apparatus

Figure 3:
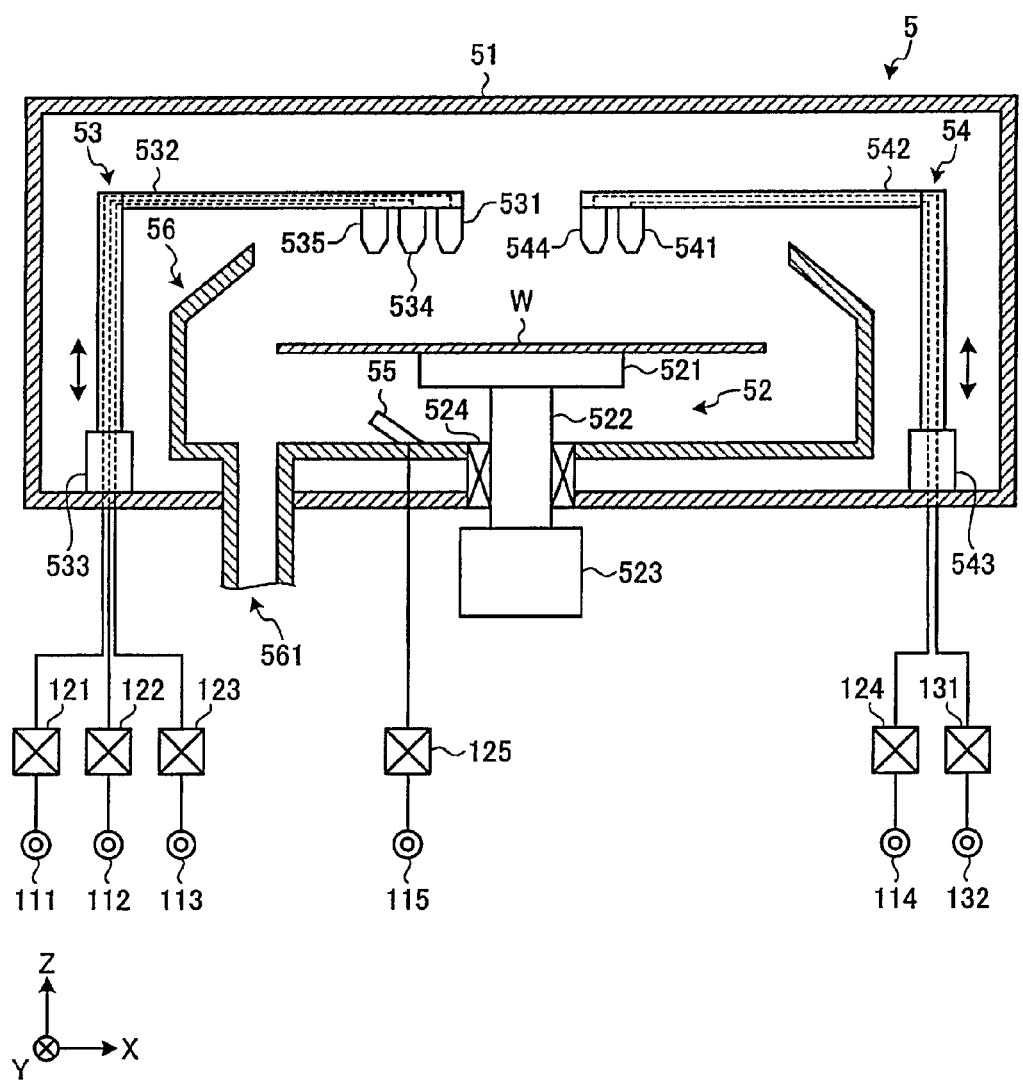
FIG. 3 is a view schematically showing the structure of a first processing apparatus.

The structure and operation of substrate cleaning apparatus 7 are described in detail. The structure of first processing apparatus 5 is described with reference to FIG. 3. FIG. 3 is a schematic view showing the structure of first processing apparatus 5. FIG. 3 shows the elements to describe the characteristics of first processing apparatus 5, and general elements are omitted from the drawing.

As shown in FIG. 3, first substrate holding device 52, solution supply devices (53, 54, 55) and collection cup 56 are provided in first chamber 51 of first processing apparatus 5.

First substrate holding device 52 is equipped with suction-holding device 521 to suction-hold wafer (W), support member 522 to support suction-holding device 521, and driver portion 523 to rotate support member 522.

Suction-holding device 521 is connected to a suction apparatus such as a vacuum pump and holds wafer (W) horizontally by suctioning the lower surface of wafer (W) using negative pressure generated when air is sucked out by the suction apparatus. For such suction-holding device 521, a porous chuck may be used, for example.

Support member 522 is formed beneath suction-holding device 521 and supported by bearing 524 so as to be rotatable in first chamber 51 and collection cup 56.

Driver portion 523 is provided under support member 522 and rotates support member 522 around a vertical axis. By so setting, wafer (W), suction-held by suction-holding device 521, is rotated.

Solution supply devices (53, 54) move from a position off wafer (W) to a position above wafer (W) to supply treatment solutions onto the main surface of wafer (W) held by first substrate holding device 52. Solution supply device 53 has nozzles (531, 534, 535), arm (532) to horizontally support nozzles (531, 534, 535), and oscillating elevator mechanism 533 to oscillate, elevate and lower arm 532. Solution supply device 54 has nozzles (541, 544), arm 542 to horizontally support nozzles (541, 544), and oscillating elevator mechanism 543 to oscillate, elevate and lower arm 542.

Solution supply device 53 supplies onto wafer (W) a predetermined chemical solution (DHF, here) from nozzle 531, DIW (pure water) as a rinsing solution from nozzle 534, and IPA (isopropyl alcohol) as a drying solvent from nozzle 535. DHF is diluted hydrogen fluoride.

More specifically, DHF supply source 111 is connected to nozzle 531 through valve 121, and DHF provided from DHF supply source 111 is supplied onto wafer (W) from nozzle 531. In addition, DIW supply source 112 is connected to nozzle 534 through valve 122, and DIW provided from DIW supply source 112 is supplied onto wafer (W) from nozzle 534. IPA supply source 113 is connected to nozzle 535 through valve 123, and IPA provided from IPA supply source 113 is supplied onto wafer (W) from nozzle 535. As described, solution supply device 53 is an example of a chemical solution supply device for supplying predetermined solutions to a substrate, as well as an example of a pure water supply device for supplying pure water to a substrate.

Solution supply device 54 supplies from nozzle 541 a topcoat solution as a film-forming treatment solution to wafer (W) while supplying from nozzle 544 MIBC (4-methyl-2-pentanol) as a solvent having affinity properties with the topcoat solution. More specifically, film-forming treatment solution supply source 114 is connected to nozzle 541 through valve 124. A topcoat solution, provided from film-forming treatment solution supply source 114, is supplied from nozzle 541 onto wafer (W). In addition, solvent supply source 132 is connected to nozzle 544 (corresponding to a "solvent supply device") through valve 131. MIBC, provided from solvent supply source 132, is supplied from nozzle 544 onto wafer (W).

MIBC is contained in a topcoat solution, and has affinity properties with the topcoat solution. Other than MIBC, it is an option to use solvents having affinity properties with a topcoat solution, for example, PGME (propylene glycol monomethyl ether), PGMEA (propylene glycol monomethyl ether acetate) or the like.

Here, nozzles (531, 534, 535, 541, 544) are provided exclusively for their respective treatment solutions. However, one nozzle may be used for multiple types of solutions. For example, it is an option to set one nozzle on arm 532, and to selectively switch the supply from that nozzle among DHF, DIW and IPA. In the same manner, it is an option to set one nozzle on arm 542, and to selectively switch the supply from that nozzle between a topcoat solution and MIBC. However, if a nozzle is shared by multiple types of solutions, any treatment solution remaining in the nozzle or pipe is drained to avoid mixing different treatment solutions. Thus, treatment solutions are wasted. By contrast, when nozzles (531, 534, 535, 541, 544) are provided exclusively for their respective solutions, there is no need to conduct a process for draining treatment solutions described above, and treatment solutions will not be wasted.

Solution supply device 55 is formed at the bottom of collection cup 56, for example, and supplies an alkaline developing solution toward the lower-surface side periphery of wafer (W). In particular, removal-solution supply source 115 is connected to solution supply device 55 through valve 125, and an alkaline developing solution provided from removal-solution supply source 115 is supplied to the lower-surface side periphery of wafer (W). Solution supply device 55 is used to remove a topcoat solution or topcoat film attached to a bevel portion or periphery of wafer (W). Details are described later.

Collection cup 56 is positioned to surround first substrate holding device 52 so as to prevent treatment solutions from being splashed. Drain port 561 is formed at the bottom of collection cup 56, and treatment solutions collected in collection cup 56 are drained from first processing apparatus 5 through drain port 561.

Figure 4:
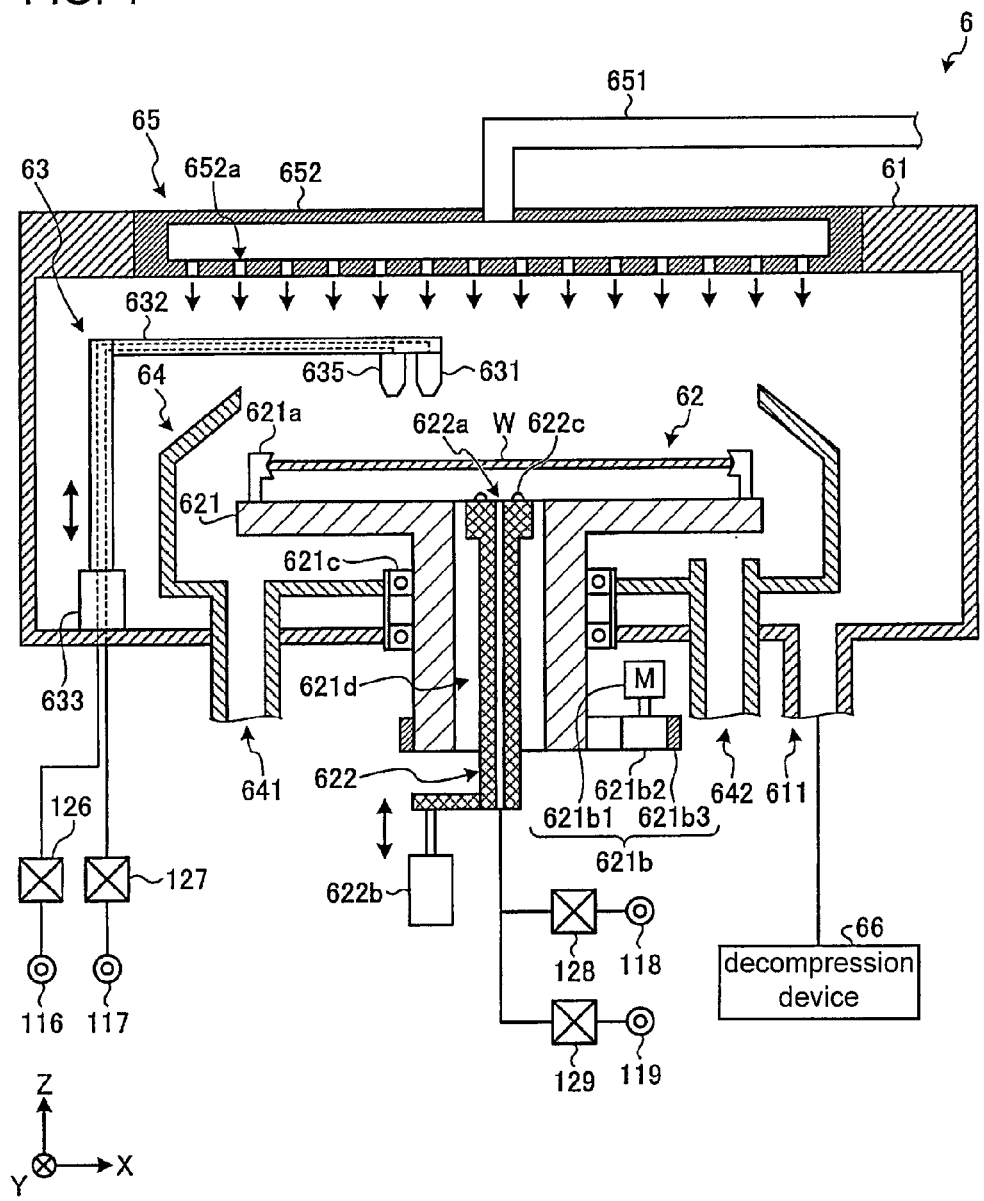
FIG. 4 is a view schematically showing the structure of a second processing apparatus.

The structure of second processing apparatus 6 is described with reference to FIG. 4. FIG. 4 is a view schematically showing the structure of second processing apparatus 6.

As shown in FIG. 4, second substrate holding device 62, solution supply device 63, collection cup 64 and current forming unit 65 are provided in second chamber 61 of second processing apparatus 6.

Second substrate holding device 62 has rotatable holding mechanism 621 to hold wafer (W) while allowing wafer (W) to rotate, and flowing-substance supply portion 622 inserted into hollow portion (621*d*) of rotatable holding mechanism 621 to supply gas to the lower surface of wafer (W).

Rotatable holding mechanism 621 is provided in substantially the center of second chamber 61. On the top surface of rotatable holding mechanism 621, holder portion (621*a*) is provided to hold the periphery of wafer (W). Wafer (W) is horizontally held by holder portion (621*a*) so that it is separated slightly from the top surface of rotatable holding mechanism 621.

Rotatable holding mechanism 621 is equipped with driver mechanism (621*b*) and is rotated around the vertical axis by driver mechanism (621*b*). In particular, driver mechanism (621*b*) has motor (621*b*1), pulley (621*b*2) attached to the output axis of motor (621*b*1), and belt (621*b*3) wound on pulley (621*b*2) and the periphery of rotatable holding mechanism 621.

Driver mechanism (621*b*) rotates pulley (621*b*2) when motor (621*b*1) is running. Rotation of pulley (621*b*2) is transferred to rotatable holding mechanism 621 by belt (621*b*3) so that rotatable holding mechanism 621 rotates around the vertical axis. When rotatable holding mechanism 621 rotates, wafer (W) held by rotatable holding mechanism 621 also rotates with rotatable holding mechanism 21. Rotatable holding mechanism 621 is supported by bearing (621*c*) so as to be rotatable in collection cup 64 and in second chamber 61.

Flowing-substance supply portion 622 is a long member inserted into hollow portion (621*d*) formed in the center of rotatable holding mechanism 621. Channel (622*a*) is formed in flowing-substance supply portion 622. N2 gas supply source 118 is connected through valve 128, and SC1 supply source 119 through valve 129, to channel (622*a*). Flowing-substance supply portion 622 supplies N2 gas and SC1 (ammonia/hydrogen peroxide solution), respectively provided from N2 gas supply source 118 and SC1 supply source 119, to the lower surface of wafer (W) through channel (622*a*).

N2 gas supplied through valve 128 is high-temperature N2 gas (approximately 90° C., for example) and is used in a vaporization acceleration process as described later.

Flowing-substance supply portion 622 is also used to transfer wafer (W). More specifically, at the base of flowing-substance supply portion 622, elevator mechanism (622*b*) is provided to vertically move flowing-substance supply portion 622. In addition, support pin (622*c*) to support wafer (W) is provided on the upper surface of flowing-substance supply portion 622.

When second substrate holding device 62 receives wafer (W) from substrate transfer device 31 (see FIG. 1), flowing-substance supply portion 622 is elevated by elevator mechanism (622*b*) and wafer (W) is put on the upper portion of support pin (622*c*). Then, second substrate holding section 62 lowers flowing-substance supply portion 622 to a predetermined position so that wafer (W) is transferred to holder portion (621a) of rotatable holding mechanism 621. In addition, when second substrate holding device 62 transfers treated wafer (W) to substrate transfer device 31, flowing-substance supply portion 622 is elevated by elevator mechanism (622b) so that wafer (W) supported by holder portion (621a) is placed on support pin (622c). Then, second substrate holding device 62 transfers wafer (W) placed on support pin (622c) to substrate transfer device 31.

Solution supply device 63 moves from a position off wafer (W) to a position above wafer (W), and supplies treatment solutions onto the main surface of wafer (W) held by second substrate holding device 62. Solution supply device 63 has nozzles (631, 635), arm 632 to horizontally support nozzles (631, 635) and oscillating elevator mechanism 633 to oscillate, elevate and lower arm 632.

Solution supply device 63 supplies wafer (W) with an alkaline developing solution as a removal solution from nozzle 631 and DIW as a rinsing solution from nozzle 635. More specifically, removal-solution supply source 116 is connected to nozzle 631 through valve 126. An alkaline developing solution, provided from removal-solution supply source 116, is supplied from nozzle 631 onto wafer (W). In addition, DIW supply source 117 is connected to nozzle 635 through valve 127. DIW, provided from DIW supply source 117, is supplied onto wafer (W).

Collection cup 64 is positioned to surround rotatable holding mechanism 621 to prevent treatment solutions from being splashed. Drain port 641 is formed at the bottom of collection cup 64, and treatment solutions collected in collection cup 64 are drained from second processing apparatus 6 through drain port 641. In addition, exhaust port 642 is formed at the bottom of collection cup 64, and N2 gas supplied from flowing-substance supply portion 622, or gas supplied from current forming unit 65 to second processing apparatus 6, is discharged from second processing apparatus 6 through exhaust port 642.

Exhaust port 611 is formed at the bottom of second chamber 61, and decompression device 66 is connected to exhaust port 611. Decompression device 66 is a vacuum pump, for example, and pumps out air from second chamber 61 to reduce the pressure.

Current forming unit 65 is installed on the ceiling of second chamber 61 and generates downflow current in second chamber 61. More specifically, current forming unit 65 has downflow gas supply pipe 651 and buffer room 652 connected to downflow gas supply pipe 651. Downflow gas supply pipe 651 is connected to the downflow gas supply source (not shown). At the bottom of buffer room 652, multiple connection holes (652a) are formed to connect buffer room 652 and second chamber 61.

Current forming unit 65 supplies downflow gas (clean gas, dry gas, etc.) to buffer room 652 via downflow gas supply pipe 651. Through multiple connection holes (652a), current forming unit 65 supplies second chamber 61 with the downflow gas provided to buffer room 652. Accordingly, downflow current is formed in second chamber 61. Downflow gas in second chamber 61 is discharged through exhaust ports (642, 611) to the outside of second processing apparatus 6.

Figure 5:
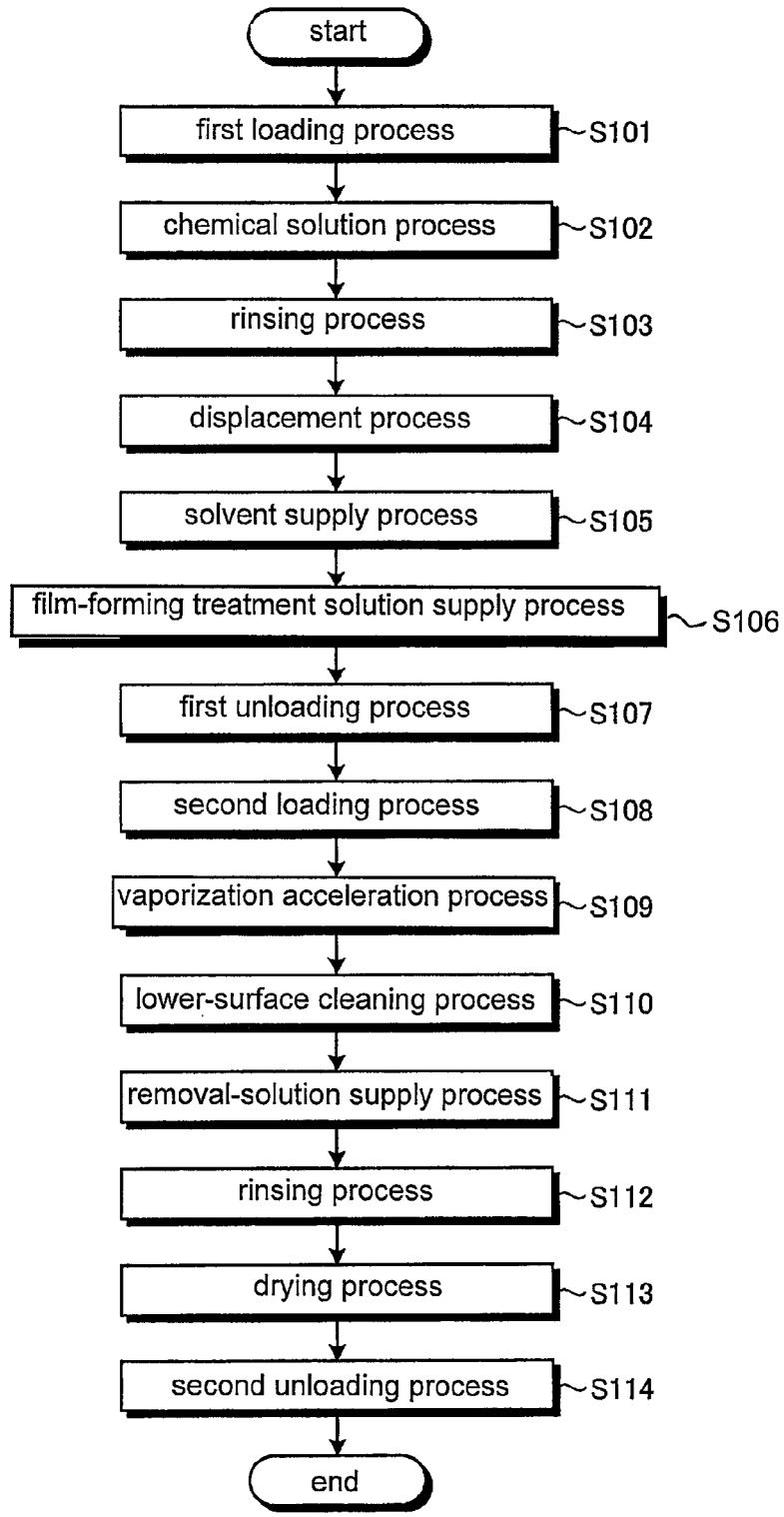
FIG. 5 is a flowchart showing the steps of a substrate cleaning process performed by a substrate cleaning apparatus.
Figure 6A:
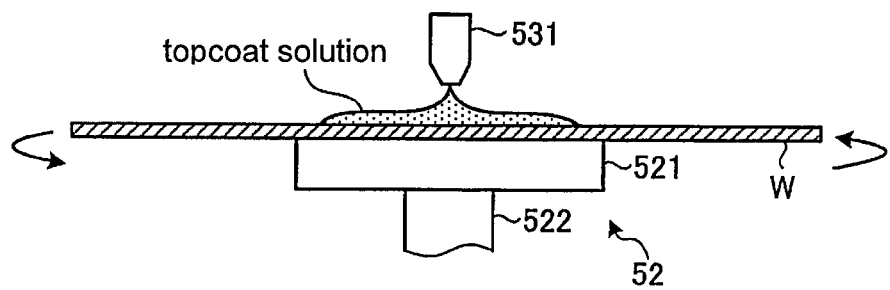
FIG. 6A is a view illustrating an operation performed by the first processing apparatus.
Figure 6B:
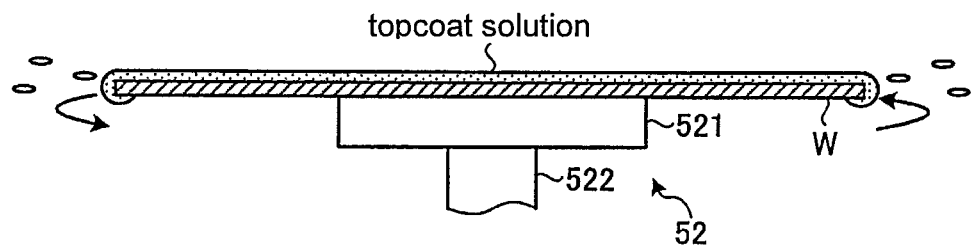
FIG. 6B is a view illustrating an operation performed by the first processing apparatus.
Figure 6C:
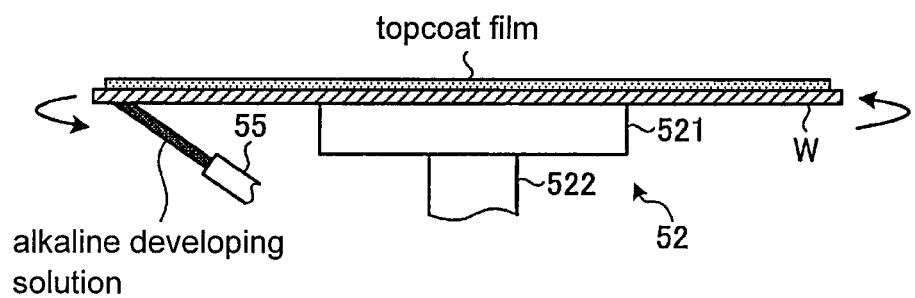
FIG. 6C is a view illustrating an operation performed by the first processing apparatus.
Figure 7A:
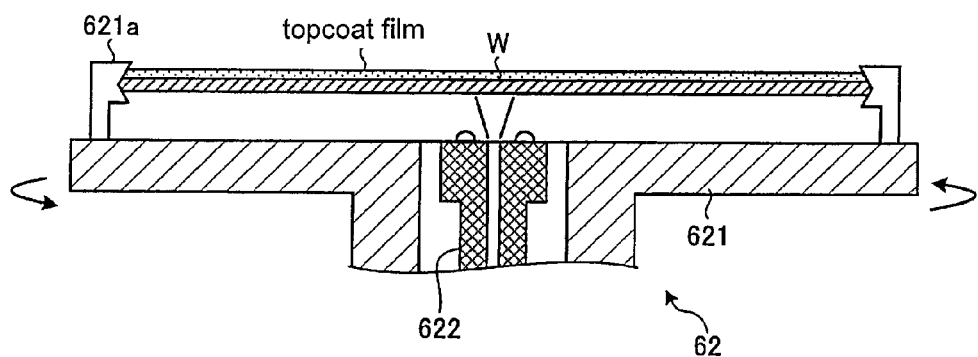
FIG. 7A is a view illustrating an operation performed by the second processing apparatus.
Figure 7B:
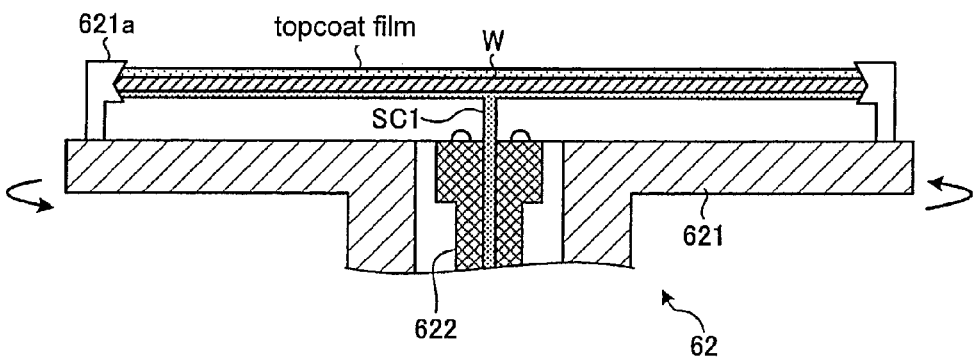
FIG. 7B is a view illustrating an operation performed by the second processing apparatus.

Specific operations of substrate cleaning apparatus 7 are described. FIG. 5 is a flowchart showing the steps of a substrate cleaning process carried out by substrate cleaning apparatus 7. Also, FIGS. 6A~6C are views illustrating operations performed by first processing apparatus 5; and FIGS. 7A, 7B and 8A~8C are views illustrating operations performed by second processing apparatus 6. In particular, FIGS. 6A~6C each show an example of film-forming treatment solution supply process (step (S106) in FIG. 5), FIG. 7A shows an example of vaporization acceleration process (step (S109) in FIG. 5), and FIG. 7B shows an example of lower-surface cleaning process (step (S110) in FIG. 5).

Figure 8A:
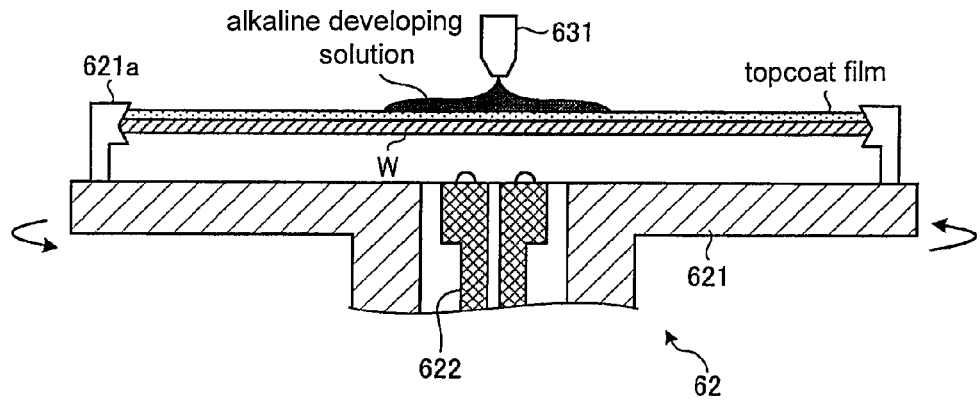
FIG. 8A is a view illustrating an operation performed by the second processing apparatus.
Figure 8B:
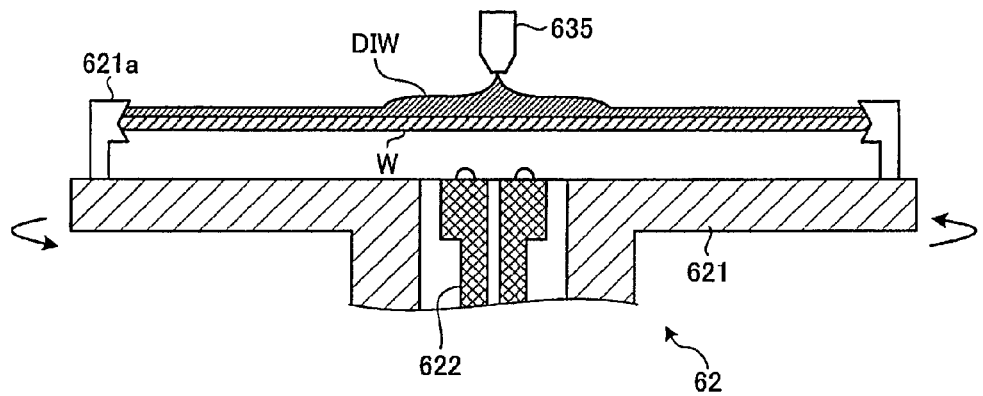
FIG. 8B is a view illustrating an operation performed by the second processing apparatus.
Figure 8C:
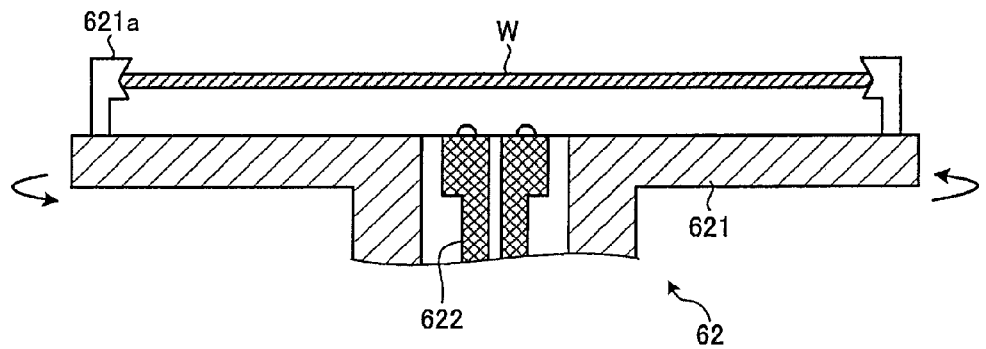
FIG. 8C is a view illustrating an operation performed by the second processing apparatus.

FIG. 8A shows an example of a removal-solution supply process (step (S111) in FIG. 5), FIG. 8B shows an example of a rinsing process (step (S112) in FIG. 5), and FIG. 8C shows an example of a drying process (step (S113) in FIG. 5). Each step in FIG. 5 is performed according to commands from control apparatus 8.

In substrate cleaning apparatus 7 of the first embodiment, steps from first loading process (step S101) through first unloading process (step S107) are conducted in first processing apparatus 5, and steps from second loading process (step S108) through second unloading process (step S114) are conducted in second processing apparatus 6.

As shown in FIG. 5, first, a first loading process is conducted in first processing apparatus 5 (step S101). In the first loading process, collection cup 56 is lowered and substrate transfer device 31 places wafer (W) on suction-holding device 521, and then wafer (W) is suction-held by suction-holding device 521. At this time, wafer (W) is held by suction-holding device 521 with its circuit-pattern surface facing upward. Then, first substrate holding device 52 is rotated by driver portion 523. Accordingly, wafer (W) rotates with first substrate holding device 52 while it is held horizontally by first substrate holding device 52.

Next, chemical solution treatment is conducted in first processing apparatus 5 (step S102). In such chemical solution treatment, nozzle 531 of solution supply device 53 is positioned above the center of wafer (W). Then, DHF as a cleaning solution is supplied from nozzle 531 onto the main surface of wafer (W). The DHF supplied to the main surface of wafer (W) is spread over the main surface of wafer (W) by centrifugal force generated as wafer (W) rotates. Accordingly, unwanted film on the entire main surface of wafer (W) is dissolved by DHF. Namely, when the surface of base film on the main surface of wafer (W) or surfaces of particles are dissolved by DHF, the adhesive force of particles is weakened, and particles are more likely to be removed.

Compared with chemical solutions in a conventional chemical cleaning process that uses chemical reactions, a chemical solution (DHF, here) used for chemical solution treatment in step (S 102) is applied under such conditions that reduce the amount of etching. Thus, compared with conventional chemical solution cleaning, erosion of base film is suppressed and particles are removed more effectively.

By conducting chemical solution treatment in step (S 102), particles are removed more effectively than when chemical solution treatment in step (S 102) is not conducted. However, chemical solution treatment in step (S 102) is optional.

The chemical solution used for chemical solution treatment in step (S 102) is not limited to DHF as long as it is a chemical solution that dissolves wafer (W), material formed on wafer (W), or foreign substances attached to wafer (W). Here, "material formed on wafer (W)" means base film on wafer (W), for example. "Foreign substances attached to wafer (W)" are, for example, particles of metallic contaminants. Also, other than DHF, examples of such a chemical solution are ammonium fluoride, hydrochloric acid, sulfuric acid, hydrogen peroxide solution, phosphoric acid, acetic acid, nitric acid, ammonium hydroxide and the like.

Next, a rinsing process is conducted to rinse the main surface of wafer (W) using DIW (step S103) in first processing apparatus 5. In such a rinsing process, nozzle 534 is positioned above the center of wafer (W). Then, valve 122 (see FIG. 3) is opened for a predetermined duration to supply DIW from nozzle 534 of solution supply device 53 to the main surface of rotating wafer (W) to wash off DHF remaining on wafer (W).

Next, in first processing apparatus 5, a displacement process is conducted (step S104). In the displacement process, nozzle 535 is positioned above the center of wafer (W). Then, valve 123 (see FIG. 3) is opened for a predetermined duration to supply IPA from nozzle 535 of solution supply device 53 to the main surface of rotating wafer (W) so as to displace DIW on wafer (W) with IPA. After that, the rotation of wafer (W) is turned off while IPA remains on wafer (W). After the displacement process is completed, nozzle 535 moves to a position off wafer (W).

Next, a solvent supply process is conducted in first processing apparatus 5 (step S105). In the solvent supply process, prior to supplying a topcoat solution to wafer (W) as a film-forming treatment solution, MIBC having affinity properties with the topcoat solution is supplied to wafer (W).

More specifically, nozzle 544 of solution supply device 54 is positioned above the center of wafer (W), and MIBC is supplied onto the main surface of wafer (W) from nozzle 544. MIBC supplied onto the main surface of wafer (W) is spread over the main surface of wafer (W) by centrifugal force generated as wafer (W) rotates.

When MIBC, which has affinity properties with a topcoat solution, is spread over wafer (W) in advance, a topcoat solution is more likely to be spread over the main surface of wafer (W) during the later-described process for supplying a film-forming treatment solution, and the topcoat solution tends to infiltrate spaces between patterns. Accordingly, particles that have penetrated into spaces between patterns are more certainly removed, and the amount of a topcoat solution to be supplied is reduced.

MIBC has affinity properties with a topcoat solution, but has low affinity properties with DIW and is hardly ever mixed with DIW. To deal with such a situation, before MIBC is supplied, DIW is displaced by IPA in first processing apparatus 5. Compared with DIW, IPA shows higher affinity with MIBC. In doing so, compared with a solvent supply process is conducted (step S105) immediately after a rinsing process (step S103), MIBC is more likely to be spread over the main surface of wafer (W), and the amount of MIBC to be supplied is reduced.

If a solvent having affinity properties with a film-forming treatment solution has affinity with DIW as well, the displacement process in step (S104) may be omitted.

In order to spread the topcoat film efficiently on the upper surface of wafer (W) in a shorter duration of time, the solvent supply process described above is preferred to be conducted. However, a solvent supply process is optional.

In a solvent supply process, drain port 561 of collection cup 56 (see FIG. 3) is connected to a collection line via diverter valve 15 (not shown). Accordingly, MIBC splashed from wafer (W) due to centrifugal force is drained to a collection line through the diverter valve from drain port 561 of collection cup 56.

Next, in first processing apparatus 5, a process for supplying a film-forming treatment solution is performed (step S106). Nozzle 541 of solution supply device 54 is positioned above the center of wafer (W) in the process for supplying a film-forming treatment solution. Then, as shown in FIG. 6A, a topcoat solution as a film-forming treatment solution is supplied from nozzle 531 onto the main surface of wafer (W) where circuits are formed without resist film.

The topcoat solution supplied onto the main surface of wafer (W) is spread over the main surface of wafer (W) by centrifugal force generated as wafer (W) rotates. Accordingly, solution film of the topcoat solution is formed on the entire main surface of wafer (W) as shown in FIG. 6B. At this time, the wettability of the main surface of wafer (W) is enhanced by MIBC supplied onto wafer (W) in step (S105). Thus, the topcoat solution is more likely to be spread over the main surface of wafer (W) while being infiltrated into gaps between patterns. Accordingly, the amount of the topcoat solution to be supplied is reduced, and particles that have penetrated into gaps of patterns are removed more certainly. In addition, the processing duration of a film-forming treatment solution supply process is shortened.

When the volatile component is vaporized by the rotation of wafer (W), the topcoat solution solidifies. Accordingly, a topcoat film is formed on the entire main surface of wafer (W). When the film-forming treatment solution supply process is completed, nozzle 531 moves to a position off wafer (W).

The topcoat solution supplied onto the main surface of wafer (W) is slightly spilled over onto the lower surface of wafer (W) from the periphery of wafer (W) as shown in FIG. 6B. Thus, a topcoat film is also formed on the bevel portion or the lower-surface side periphery of wafer (W).

Then, in first processing apparatus 5, after a topcoat solution is supplied onto the main surface of wafer (W) from nozzle 531, a removal solution (an alkaline developing solution, here) is supplied from solution supply device 55 to the lower-surface side periphery of wafer (W) as shown in FIG. 6C. The alkaline developing solution is supplied to the lower-surface side periphery of wafer (W) and then spilled over onto the main-surface side periphery from the bevel portion of wafer (W). Accordingly, such process removes the topcoat film or topcoat solution attached to the lower-surface side periphery, bevel portion and main-surface side periphery of wafer (W). Then, the rotation of wafer (W) is turned off.

Next, a first unloading process is conducted in first processing apparatus 5 (step S107). In the first unloading process, collection cup 56 is lowered, and wafer (W) held by first substrate holding device 52 is transferred to substrate transfer device 31. Wafer (W) is unloaded from first processing apparatus 5 as the topcoat solution has solidified and a topcoat film has been formed on the circuit-pattern surface.

Next, in second processing apparatus 6, a second loading process is conducted (step (S108)). In the second loading process, after substrate transfer device 31 has placed wafer (W) on support pin (622c) of flowing-substrate supply portion 622, wafer (W) is held by holder portion (621a) of rotatable holding mechanism 621. At this time, wafer (W) is held by holder portion (621a) with its circuit-pattern surface facing upward. Then, rotatable holding mechanism 621 is rotated by driver mechanism (621b). Accordingly, wafer (W) rotates with rotatable holding mechanism 621 while it is held horizontally by rotatable holding mechanism 621.

Next, a vaporization acceleration process is conducted in second processing apparatus 6 (step S109). In the vaporization acceleration process, vaporization of the volatile component contained in the topcoat solution that forms film on the entire main surface of wafer (W) is further accelerated. More specifically, valve 128 (see FIG. 4) is opened for a predetermined duration to supply high-temperature N2 gas from flowing-substance supply portion 622 to the lower surface of rotating wafer (W) as shown in FIG. 7A. Accordingly, wafer (W) as well as the topcoat solution is heated to accelerate vaporization of the volatile component.

The pressure in second chamber 61 is reduced by decompression device 66 (see FIG. 4). By doing so, vaporization of the volatile component is also accelerated. Moreover, downflow gas is supplied from current forming unit 65 during the substrate cleaning process. When humidity in current forming unit 65 is lowered by downflow gas, vaporization of the volatile component is also accelerated.

When the volatile component is vaporized, the topcoat solution solidifies or cures while its volume contracts and a topcoat film is formed. Accordingly, particles attached to wafer (W) and the like are removed from wafer (W) and the like.

Using substrate cleaning apparatus 7, the duration until a film-forming treatment solution solidifies or cures is reduced by accelerating vaporization of the volatile component contained in the film-forming treatment solution. Also, when wafer (W) is heated, since curing contraction of the synthetic resin contained in the film-forming treatment solution is facilitated, the contraction rate of the film-forming treatment solution is further heightened, compared with an example when wafer (W) is not heated.

Flowing-substance supply portion 622, decompression device 66 and current-forming unit 65 are examples of a "vaporization acceleration device." Here, second processing apparatus 6 is equipped with flowing-substance supply portion 622, decompression device 66 and current-forming unit 65 as the vaporization acceleration section. However, it is an option for second processing apparatus 6 to be structured with any one of those.

So far, an example has been shown in which second processing apparatus 6 performs a vaporization acceleration process. However, it is an option to omit such a vaporization acceleration process. Namely, second processing apparatus 6 may be put in a standby mode until a topcoat solution naturally solidifies or cures. It is also an option to turn off the rotation of wafer (W) while the topcoat solution is vaporized. Alternatively, the vaporization of a topcoat solution may be accelerated by rotating wafer (W) at a speed that prevents the topcoat solution from being totally shaken off so as not to expose the main surface of wafer (W).

Next, in second processing apparatus 6, a lower-surface cleaning process is conducted (step S110). In the lower-surface cleaning process, SC1 is supplied to the lower surface of rotating wafer (W) from flowing-substance supply portion 622 by opening valve 129 (see FIG. 4) for a predetermined duration (see FIG. 7B). By doing so, the lower surface of wafer (W) is cleaned. SC1 supplied to the lower surface of wafer (W) is drained to a drain line through a diverter valve (not shown) from drain port 641 of collection cup 64. Flowing-substance supply portion 622 is also an example of a lower-surface cleaning device, which supplies a cleaning solution mainly to the lower surface of wafer (W) held by holder portion (621a).

In substrate cleaning apparatus 7 of the first embodiment, a process for supplying a film-forming treatment solution is set to be conducted in first processing apparatus 5 equipped with suction-holding device 521, which suction-holds the lower surface of wafer (W). Therefore, application of the topcoat solution is unlikely to miss the periphery of wafer (W), compared with an example in which the periphery of wafer (W) is held by a type of substrate holding device such as second substrate holding device 62 in second processing apparatus 6. Also, since the topcoat solution is not attached to the substrate holding device, wafer (W) is unlikely to be contaminated by being held by the substrate holding device with attached topcoat solution.

In substrate cleaning apparatus 7 of the first embodiment, the lower-surface cleaning process is set to be conducted in second processing apparatus 6 equipped with rotatable holding mechanism 621 to hold the periphery of wafer (W). Thus, contaminants on the lower surface of wafer (W), especially the contaminants from suction-holding device 521 of first processing apparatus 5, are removed, In substrate cleaning apparatus 7 of the first embodiment, the lower surface of wafer (W) is set to be cleaned as the main surface of wafer (W) is coated with a solidified or cured topcoat solution. Thus, even if the cleaning solution is spun off during the lower-surface cleaning process, the main surface of wafer (W) is prevented from being contaminated by the cleaning solution. Also, the main surface of wafer (W) is prevented from being contaminated when the cleaning solution spills over onto the main surface.

Here, an example has been described in which a lower-surface cleaning process is conducted after a vaporization acceleration process. However, the lower-surface cleaning process may be conducted after a second loading process and before the vaporization acceleration process.

Next, in second processing apparatus 6, a removal-solution supply process (step S111) is conducted. In the removal-solution supply process, nozzle 631 is positioned above the center of wafer (W) as shown in FIG. 8A. Then, valve 126 (see FIG. 4) is opened for a predetermined duration to supply an alkaline developing solution as a removal solution onto rotating wafer (W) from nozzle 631. By doing so, the topcoat film formed on wafer (W) is dissolved and removed.

During that time, since wafer (W) and the like are charged with zeta potential of the same polarity as that on particles, wafer (W) and the like repel the particles. Thus, reattachment of the particles onto wafer (W) and the like is prevented.

The removal solution spun off from wafer (W) by centrifugal force is drained from drain port 641 of collection cup 64 to a collection line through a valve (not shown). The removal solution drained to a collection line is recycled.

It is an option for drain port 641 to be kept connected to the drain line for a predetermined duration from when the supply of a removal solution is started until the topcoat film is sufficiently removed, and then to be switched to the collection line. In so setting, the topcoat solution is prevented from being mixed into the recyclable removal solution.

Next, in second processing apparatus 6, a rinsing process is conducted by using DIW to rinse the main surface of wafer (W) (step S112). In the rinsing process, nozzle 635 is positioned above the center of wafer (W) as shown in FIG. 8B. Then, valve 127 (see FIG. 4) is opened for a predetermined duration to supply DIW to the main surface of rotating wafer (W) from nozzle 635 of solution supply device 63. Accordingly, the topcoat film or the alkaline developing solution remaining on wafer (W) is washed off.

In particular, DIW supplied onto wafer (W) is spread over wafer (W) as wafer (W) rotates while being spun off from wafer (W). Particles floating in the dissolved topcoat film or in the alkaline developing solution are removed from wafer (W) along with DIW during the rinsing process. At that time, the air in second chamber 61 is promptly emitted by downflow current formed in current-forming unit 65. When the rinsing process is completed, nozzle 635 moves to a position off wafer (W).

In second processing apparatus 6, a drying process is conducted (step S113). In the drying process, the rotation speed of wafer (W) is increased for a predetermined duration so that DIW remaining on the main surface of wafer (W) is spun off, and wafer (W) is dried (see FIG. 8C). Then, the rotation of wafer (W) is turned off.

In second processing apparatus 6, a second unloading process is conducted (step S114). In the substrate unloading process, flowing-substance supply portion 622 is elevated by elevator mechanism (622b) (see FIG. 4) and wafer (W) held by holder portion (621a) is placed on support pin (622c). Then, wafer (W) on support pin (622c) is transferred to substrate transfer device 31. When such a substrate unloading process is finished, substrate cleaning treatment on wafer (W) is completed. Wafer (W) is unloaded from second processing apparatus 6 with its circuit-pattern surface being exposed.

Substrate cleaning system 100 of the first embodiment has first processing apparatus 5 and second processing apparatus 6. First processing apparatus 5 includes first substrate holding device 52 (an example of a first holding device) to hold wafer (W), and solution supply device 54 (an example of a first supply device) to supply wafer (W) with a treatment solution that contains a volatile component and forms film on the entire main surface of a substrate. Second processing apparatus 6 is structured to be different from first processing apparatus 5, and includes second substrate holding device 62 (an example of a second holding device) to hold wafer (W), and solution supply device 63 (an example of second supply device) to supply wafer (W) with a removal solution that dissolves the entire film formed when the treatment solution supplied to the substrate from solution supply device 53 solidifies or cures on the substrate through vaporization of the volatile component.

Therefore, according to the first embodiment, particles attached to wafer (W) are removed, and pattern collapse or erosion of base film is prevented.

In substrate cleaning system 100 of the first embodiment, different substrate holding devices are used respectively in a film-forming treatment solution supply process and a removal-solution supply process. In particular, since a film-forming treatment solution supply process is conducted in first processing apparatus 5 equipped with suction-holding device 521 that suction-holds the lower surface of wafer (W), application failure of a topcoat solution to the periphery of wafer (W) or attachment of the topcoat solution to the substrate holding device is prevented. In addition, since a removal-solution supply process is conducted in second processing apparatus 6 equipped with rotatable holding mechanism 621 to hold the periphery of wafer (W), the lower surface of wafer (W) is cleaned before the removal-solution supply process, and contamination from suction-holding device 521 of first processing apparatus 5 is removed. Also, attachment of the topcoat solution to the second holding device is prevented.

In substrate cleaning system 100 of the first embodiment, an alkaline removal solution is used. Accordingly, wafer (W) and the like are charged with zeta potential of the same polarity as that on particles, thus preventing the particles from reattaching to wafer (W). The efficiency of removing particles is enhanced.

Comparison with Cleaning Method Using Physical Force

Figure 15A:
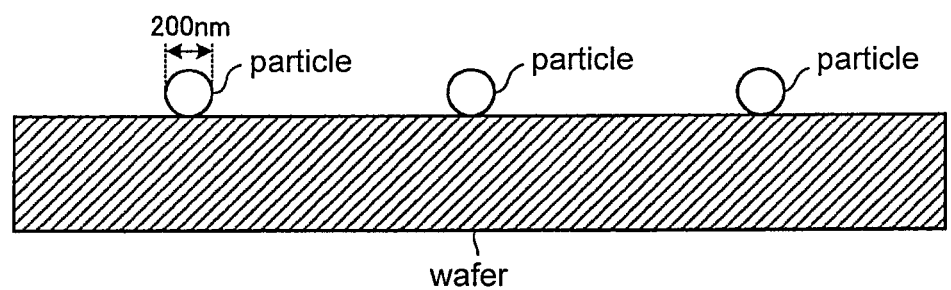
FIG. 15A is a view illustrating conditions for comparing the cleaning method related to an embodiment of the present invention and two-fluid cleaning.
Figure 15B:
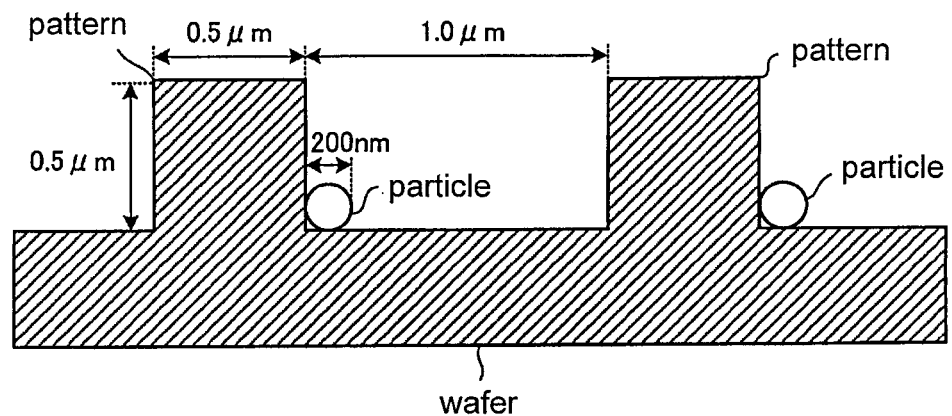
FIG. 15B is a view illustrating conditions comparing the cleaning method related to an embodiment of the present invention and two-fluid cleaning.

Descriptions are provided for comparison results between a two-fluid cleaning method using physical force and the substrate cleaning method according to the first embodiment (hereinafter referred to as "the present cleaning method"). First, comparison conditions are described with reference to FIGS. 15A and 15B. FIGS. 15A and 15B are views illustrating conditions when the present cleaning method and a two-fluid method are compared.

A wafer without patterns (see FIG. 15A) and a wafer with patterns where 0.5 μm-high and 0.5 μm-wide patterns are formed at 1.0 μm pitch (see FIG. 15B) are prepared as shown in FIGS. 15A and 15B, and cleaned by a two-fluid cleaning method and by the present cleaning method. Then, particle removal rates of two cleaning methods are compared. The particle diameter of particles is 200 nm.

Each cleaning method was conducted under both a "no-damage condition" and a "damage condition." "No-damage condition" indicates that 2 nm-thick thermal oxide film is formed on a wafer, and 100 nm-high and 45 nm-wide sample patterns are formed on the thermal oxide film, and that the wafer is cleaned using force at a predetermined level that does not collapse the sample patterns. Also, "damage condition" indicates that a wafer prepared the same as above is cleaned using force at a predetermined level that would collapse the sample patterns.

Figure 16:
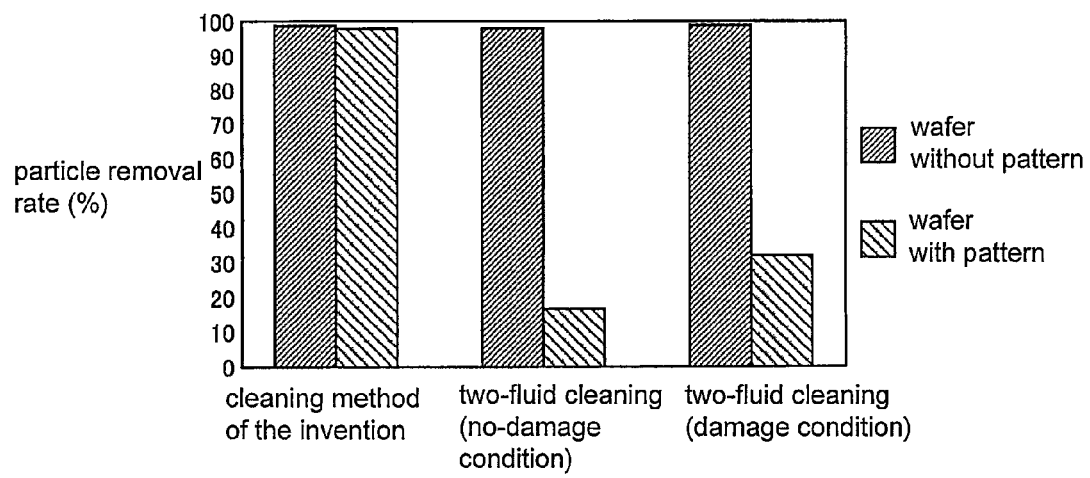
FIG. 16 is a graph showing results of comparing the cleaning method related to an embodiment of the present invention and two-fluid cleaning.

Comparison results are shown in FIG. 16. FIG. 16 is a graph showing the results of comparing the present cleaning method and a two-fluid cleaning method. In FIG. 16, the particle removal rate of a wafer without patterns is shown by a bar with hatching lines sloping to the left, and the particle removal rate of a wafer with patterns is shown by a bar with hatching lines sloping to the right. Sample patterns did not collapse by the present cleaning method. Thus, only the result of a "no-damage condition" is shown regarding the present cleaning method.

As shown in FIG. 16, when wafers without patterns were cleaned by the present cleaning method, by a two-fluid method (no-damage condition) and by the two-fluid method (damage condition), particle removal rates were each almost 100%, showing hardly any significant difference between the two cleaning methods.

On the other hand, when wafers with patterns were cleaned, the particle removal rates by a two-fluid cleaning method were approximately 17% under the no-damage condition and approximately 32% under the damage condition, showing a significant reduction from the particle removal rates on wafers without patterns. Since the particle removal rate on a wafer with patterns was lowered significantly from the particle removal rate on a wafer without patterns, it is found that particles that have penetrated into spaces between patterns are difficult to remove using a two-fluid cleaning method.

By contrast, using the present cleaning method, particle removal rates were almost 100% on both a wafer without patterns and a wafer with patterns. Since particle removal rates showed hardly any difference between a wafer without patterns and a wafer with patterns, it is found that particles that have penetrated into spaces between patterns are removed properly by the present cleaning method.

As described, compared with a two-fluid cleaning method, not only are patterns less likely to collapse but particles that have penetrated into spaces between patterns are removed properly using the present cleaning method.

Comparison with Cleaning Method Using Chemical Reactions

Figure 14:
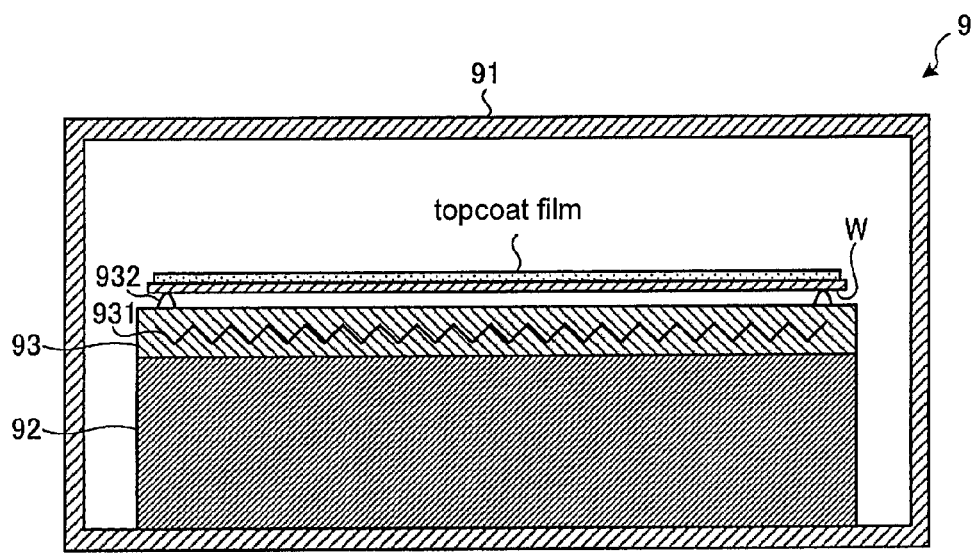
FIG. 14 is a view schematically showing an example of the structure of a third processing apparatus.

A cleaning method using an SC1 (ammonia-hydrogen peroxide solution) chemical solution, which is a cleaning method using chemical reactions, is compared with the present cleaning method. FIGS. 14 and 15 are graphs showing comparison results of the present cleaning method and a chemical solution method. FIG. 14 shows comparison results of particle removal rates, and FIG. 15 shows comparison results of film loss. Film loss means the erosion depth of thermal oxide film formed on a wafer as base film.

Chemical solution cleaning uses SC1 prepared by mixing ammonia, water and hydrogen peroxide at a ratio of 1:2:40, and cleaning was conducted at a temperature of 60° C. with a supply duration of 600 seconds. Regarding the present cleaning method, a topcoat solution was supplied, a vaporization acceleration process was conducted and an alkaline developing solution was supplied for 10 seconds. Wafers with patterns shown in FIG. 15B were used.

Figure 17:
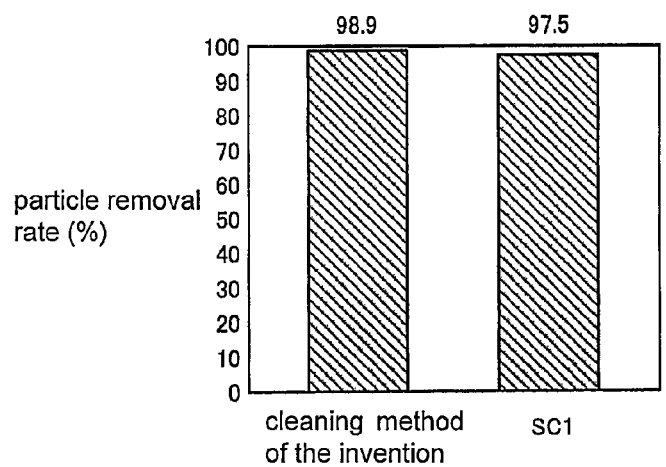
FIG. 17 is a graph showing results of comparing the cleaning method related to an embodiment of the present invention and chemical cleaning.
Figure 18:
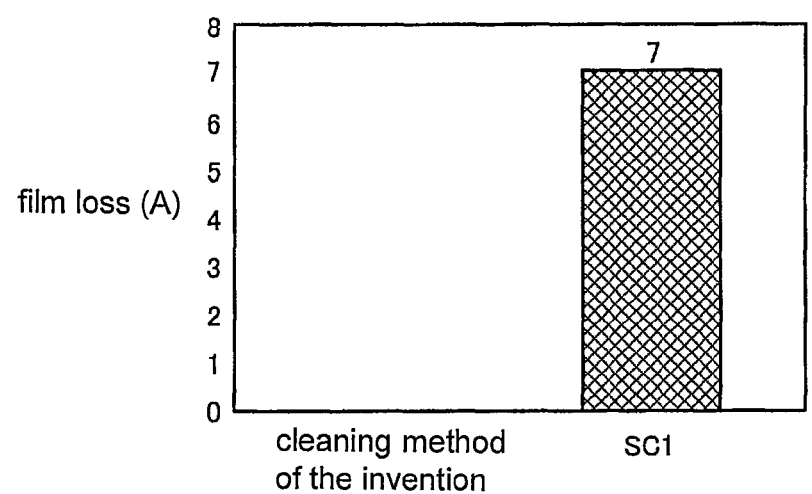
FIG. 18 is a graph showing results of comparing the cleaning method related to an embodiment of the present invention and chemical cleaning.

As shown in FIG. 17, since the particle removal rate by a chemical solution method was 97.5%, which is slightly lower than the particle removal rate by the present cleaning method (98.9%), it is found that particles that had penetrated into spaces between patterns were properly removed, unlike the above-described two-fluid cleaning method.

Also, as shown in FIG. 15, film loss at 7A (angstrom) occurred after a chemical solution cleaning, but no film loss was observed by the present cleaning method. As described, it is found that the present cleaning method does not erode base film and removes particles that have penetrated into spaces between patterns.

As found above, according to the present cleaning method, particle collapse or base film erosion is prevented while particles that have penetrated into spaces between patterns are properly removed. Thus, the present cleaning method is more effective than cleaning methods using physical force or chemical reactions.

In the first embodiment above, a first holding device equipped in first processing apparatus 5 is a vacuum chuck to suction-hold to wafer (W). However, the first holding device of first processing apparatus 5 is not limited to a vacuum chuck. For example, it may be a mechanical chuck to hold the periphery of wafer (W), the same as second substrate holding device 62 equipped in second processing apparatus 6. Alternatively, it may also be such a holding device that holds the lower-surface side periphery of wafer (W) (namely, simply to place wafer (W) thereon).

In the first embodiment above, after a chemical treatment is conducted (step (S102) in FIG. 5), a rinsing process, a displacement process and a solvent supply process (steps (S103)~(S105) in FIG. 5) are conducted, followed by a film-forming treatment solution supply process (step (S106) in FIG. 5). However, it is an option for first processing apparatus 5 to conduct a film-forming treatment solution supply process without conducting a chemical treatment, a rinsing process, a displacement process and a solvent supply process.

In the first embodiment, a lower-surface cleaning process was conducted by supplying SC1 to the lower surface of wafer (W). However, the lower-surface cleaning process is not limited to such a process. For example, as a lower-surface cleaning process, it is an option to conduct brush cleaning using a brush, two-fluid cleaning using a two-fluid nozzle to spray a cleaning solution mist formed by a gas onto the lower surface of wafer (W), or ultrasonic cleaning using an ultrasonic oscillator or the like.

In the first embodiment, a lower-surface cleaning process is set to be conducted when the main surface of wafer (W) is coated with topcoat film. However, that is not the only option. For example, a polishing process using a polishing brush to polish the lower surface or the bevel portion of wafer (W), or an etching process using a chemical solution to etch the lower surface or the bevel portion of wafer (W) may also be used. An etching process means removing oxide film using hydrofluoric acid (HF), for example.

When the other surface of wafer (W) is treated after the entire main surface of wafer (W) is coated with a topcoat film, contamination on the main surface of wafer (W) is prevented while the other surface of wafer (W) is treated. Also, when the other surface of wafer (W) is etched after the entire main surface of wafer (W) is coated with a topcoat film, even if the chemical solution is spilled over from the lower-surface side to the main-surface side of wafer (W), the main surface of wafer (W) will not be etched since it is protected by the topcoat film. Accordingly, since the etching region is determined by the topcoat film, etching is conducted accurately.

Second Embodiment

Figure 9:
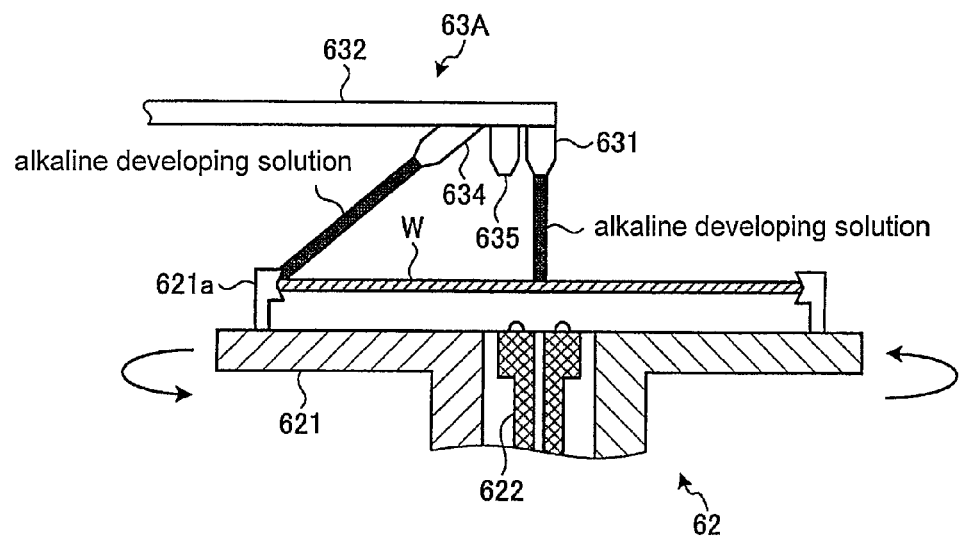
FIG. 9 is a view schematically showing the structure of a second processing apparatus according to a second embodiment.

The structure of a substrate cleaning apparatus is not limited to that in the first embodiment. Another structure of a substrate cleaning apparatus is described in the following with reference to FIG. 9. FIG. 9 is a schematic view illustrating the structure of a substrate cleaning apparatus according to a second embodiment. In the following, regarding a portion corresponding to or identical to what was already described above, the same reference number is applied and redundant descriptions are omitted here.

As shown in FIG. 9, a second processing apparatus of the second embodiment has solution supply device (63A) in place of solution supply device 63 equipped in second processing apparatus 6 of the first embodiment (see FIG. 4).

Solution supply device (63A) further includes nozzle 634 in addition to nozzles (631, 635). Nozzle 634 is diagonally supported by arm 632, and its discharge port is pointed toward the periphery of wafer (W) when nozzle 634 is positioned above the center of wafer (W). Nozzle 634 is an example of a third supply device. Nozzle 634 is connected to removal-solution supply source 116 (see FIG. 4) through a valve not shown here. Along the periphery of wafer (W), nozzle 634 discharges an alkaline developing solution provided from removal-solution supply source 116. Accordingly, an alkaline developing solution under sufficient flow rate and velocity to clean holder portion (621a) is supplied to holder portion (621a).

The valve connected to nozzle 634 is a valve different from valve 126 (see FIG. 4) connected to nozzle 631. Therefore, the timing of turning on/off the supply of an alkaline developing solution is controlled separately for nozzle 631 and nozzle 634. Since the rest of the structure is the same as second processing apparatus 6 of the first embodiment, the descriptions are omitted here.

The second processing apparatus of the second embodiment performs a cleaning process of holder portion (621a) using solution supply device (63A) according to commands from control apparatus 8. More specifically, in the above-described removal-solution supply process (step (S111) in FIG. 5), after nozzle 631 is positioned above the center of wafer (W), a valve (not shown) connected to nozzle 634 and valve 126 (see FIG. 4) are opened for a predetermined duration to supply an alkaline developing solution as a removal solution to rotating wafer (W) from nozzle 631 and to the periphery of wafer (W) from nozzle 634.

Accordingly, a topcoat film attached to holder portion (621a) is dissolved and removed from holder portion (621a). Namely, holder portion (621a) is cleaned.

The valve connected to nozzle 634 is turned off before valve 126 (see FIG. 4) is turned off By doing so, the supply of the alkaline developing solution from nozzle 634 to holder portion (621a) is turned off prior to stopping the supply of the alkaline developing solution from nozzle 631 to wafer (W).

Accordingly, even if the topcoat film attached to holder portion (621*a*) is removed and spun over onto wafer (W) by the alkaline developing solution supplied from nozzle 634, such spun-off topcoat film is prevented from reattaching to wafer (W) by the alkaline developing solution supplied from nozzle 631 and is washed off.

A substrate cleaning apparatus of the second embodiment is further equipped with nozzle 634 to supply an alkaline developing solution to holder portion (621*a*). Thus, the topcoat film attached to holder portion (621*a*) is also removed, and contamination or damage to wafer (W) or the raising of dust is prevented.

In the present embodiment, prior to stopping the supply of the alkaline developing solution from nozzle 631 to wafer (W), the supply of the alkaline developing solution from nozzle 634 to holder portion (621*a*) is turned off. However, the timing of turning off nozzle 634 is not limited to the above. For example, the supply of the alkaline developing solution from nozzle 634 to holder portion (621*a*) may be turned off before the rinsing process is finished, namely, before the supply of DIW from nozzle 631 to wafer (W) is turned off. In such an example as well, the topcoat film, removed from holder portion (621*a*) by DIW supplied from nozzle 631, is washed off and prevented from reattaching to wafer (W).

It is sufficient as long as the supply of the alkaline developing solution from nozzle 634 to holder portion (621*a*) is turned off before the supply of the treatment solution (alkaline developing solution or DIW) from nozzle 631 to wafer (W) is turned off.

Third Embodiment

Figure 10A:
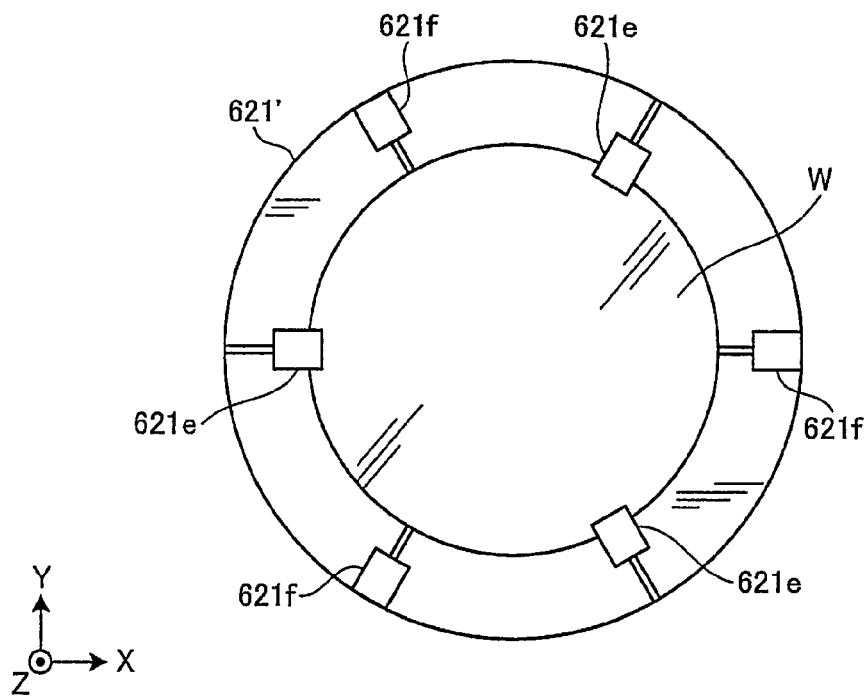
FIG. 10A is a view schematically showing a modified example of a rotatable holding mechanism in the second processing apparatus.
Figure 10B:
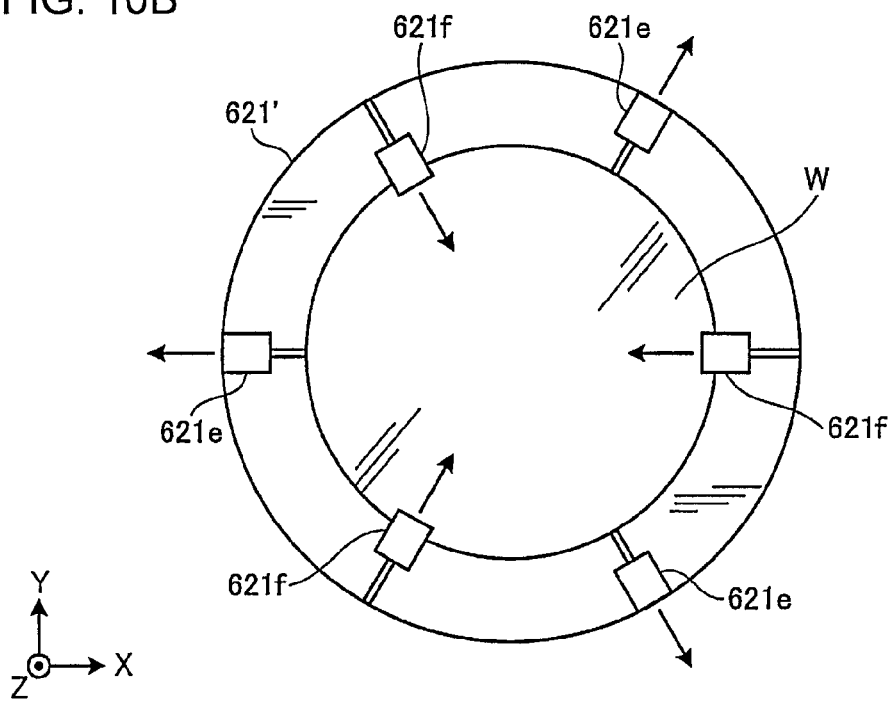
FIG. 10B is a view schematically showing a modified example of the rotatable holding mechanism in the second processing apparatus.

A substrate cleaning apparatus according to a third embodiment is described. FIGS. 10A and 10B are views schematically showing a modified example of a rotatable holding mechanism equipped in the second processing apparatus.

As shown in FIG. 10A, instead of rotatable holding mechanism 621 equipped in second processing apparatus 6 of the first embodiment (see FIG. 4), the second processing apparatus of the third embodiment is equipped with rotatable holding mechanism (621'). Since the rest of the structure is the same as in the second processing apparatus 6, the descriptions are omitted here.

Instead of holder portion (621*a*) in rotatable holding mechanism 621, rotatable holding mechanism (621') has first holder portion (621*e*) to hold wafer (W), and has second holder portion (621*f*) that is set to be movable independently of first holder portion (621*e*).

Multiple first holder portions (621*e*) are provided at equal intervals along the periphery of wafer (W). Here, three are positioned at an interval of 120 degrees to be movable in a radial direction of wafer (W). In addition, second holder portions (621*f*) are positioned to have equal intervals between first holder portions (621*e*), and are movable in a radial direction of wafer (W), the same as first holder portions (621*e*).

The second processing apparatus of the third embodiment has two types of holder portions, which are movable independently of each other. The holding hands of wafer (W) are switchable using those holder portions.

For example, wafer (W) is held by first holder portions (621*e*) in FIG. 10A. Then, after second holder portions (621*f*) are moved closer to wafer (W), first holder portions (621*e*) are moved away from wafer (W) so that the holding hands of wafer (W) are switched from first holder portions (621*e*) to second holder portions (621*f*) as shown in FIG. 10B.

Figure 11A:
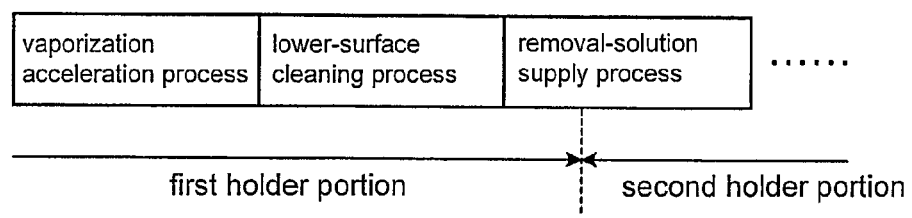
FIG. 11A is a view showing an example of timing for switching the holding hands of a wafer.

The timing of switching the holding hands of wafer (W) is described with reference to FIGS. 11A~11C. FIG. 11A shows timing of switching the holding hands of wafer (W). Also, FIGS. 11B and 11C show other examples of timing of switching the holding hands of wafer (W).

As shown in FIG. 11A, switching the holding hands of wafer (W) between first holder portions (621*e*) and second holder portions (621*f*) is performed according to predetermined timing during a removal-solution supply process (step (S 110) in FIG. 5). More specifically, after the removal-solution supply process has started, and when the topcoat film is mostly washed away by the alkaline developing solution so that the topcoat film is unlikely to attach to second holder portions (621*f*), second holder portions (621*f*) are moved toward wafer (W), and then first holder portions (621*e*) are moved away from wafer (W).

In the third embodiment, the holding hands of wafer (W) are switched between first holder portions (621*e*) and second holder portions (621*f*). Thus, even if the topcoat film is attached to first holder portions (621*e*), contamination or damage to wafer (W) or the raising of dust is prevented by switching the holding hands to second holder portions (621*f*).

Figure 11B:
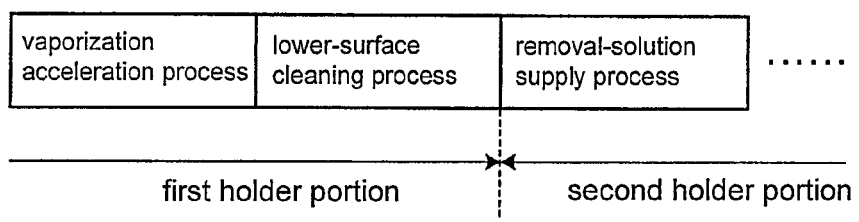
FIG. 11B is a view showing another example of timing for switching the holding hands of a wafer.
Figure 11C:
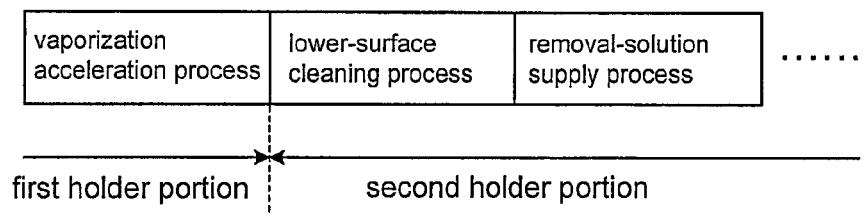
FIG. 11C is a view showing yet another example of timing for switching the holding hands of a wafer.

It is an option to switch the holding hands from first holder portions (621*e*) to second holder portions (621*f*) immediately after the lower-surface cleaning process as shown in FIG. 11B, or immediately after the vaporization acceleration process is finished as shown in FIG. 11C. When the topcoat solution solidifies, it is unlikely to attach to second holder portions (621*f*). Thus, if the holding hands of wafer (W) are switched immediately after the vaporization acceleration process, contamination or damage to wafer (W) or the raising of dust is prevented.

The second processing apparatus of the third embodiment may have a nozzle to supply an alkaline developing solution to first holder portions (621*e*) the same as in the second processing apparatus of the second embodiment, or may be set to constantly clean first holder portions (621*e*) using such a nozzle. Such a cleaning process is preferred to be conducted when wafer (W) is not present in second chamber 61.

Fourth Embodiment

Figure 12A:
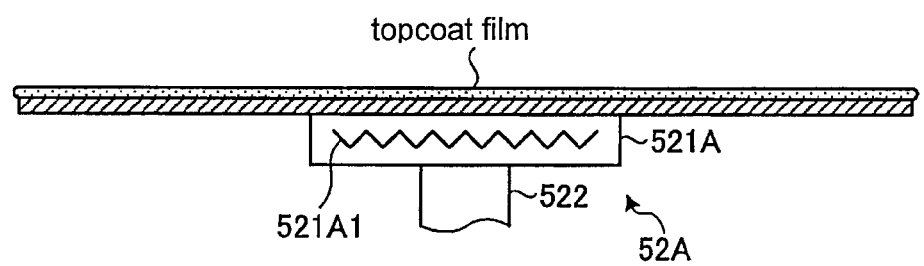
FIG. 12A is a view showing a modified example for providing a vaporization acceleration mechanism in the first processing apparatus.
Figure 12B:
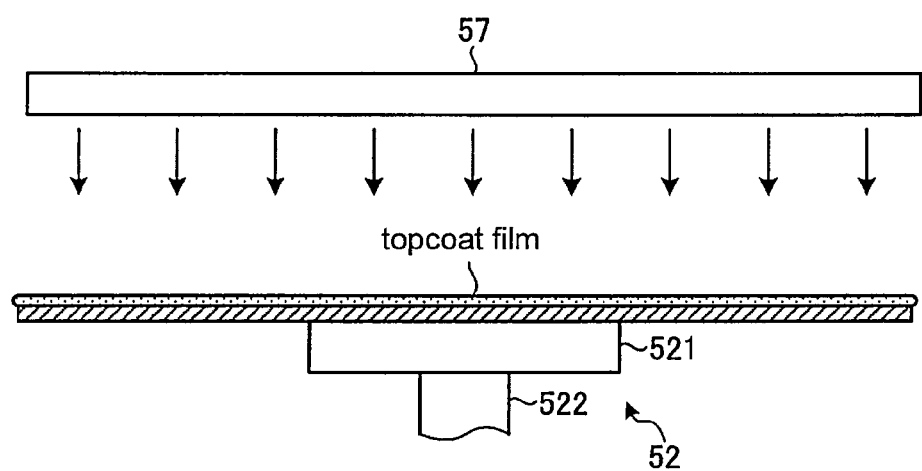
FIG. 12B is a view showing another modified example for providing a vaporization acceleration mechanism in the first processing apparatus.

In each embodiment above, a film-forming treatment solution supply process is set to be conducted in a first processing apparatus, and a vaporization acceleration process and a removal-solution supply process are set to be conducted in a second processing apparatus. However, a vaporization acceleration process may be conducted in a first processing apparatus. In the following, a modified example in which a vaporization acceleration mechanism is provided in a first processing apparatus is described by referring to FIGS. 12A and 12B. FIGS. 12A and 12B are views each showing a modified example in which a vaporization acceleration mechanism is provided in a first processing apparatus.

As shown in FIG. 12A, a first processing apparatus has first substrate holding device (52A), for example, instead of first substrate holding device 52. In suction-holding device (521A) equipped in first substrate holding device (52A), heating portion (521A1) is formed, and a vaporization acceleration process is conducted by heating portion (521A1). Namely, the topcoat solution is heated by heating portion (521A1). The heating temperature is 90° C., for example. Accordingly, vaporization of the volatile component contained in the topcoat solution is accelerated.

As described, by providing heating portion (521A1) in suction-holding device (521A), wafer (W), suction-held by the suction-holding device, is directly heated, thus effectively accelerating vaporization of the volatile component contained in the topcoat solution. Heating portion (521A1) is an example of a vaporization acceleration device.

Alternatively, UV-ray irradiation section 57 may be provided in a first processing apparatus as a vaporization acceleration device as shown in FIG. 12B. UV-ray irradiation section 57 is a UV (ultraviolet) lamp, for example, which is positioned above wafer (W), and irradiates ultraviolet rays toward the main surface of wafer (W) from above wafer (W). By doing so, the topcoat solution is activated and vaporization of its volatile component is accelerated.

UV-ray irradiation section 57 is preferred to be positioned higher than nozzles (531, 541) of solution supply devices (53, 54) to avoid interference with procedures performed by solution supply devices (53, 54). Alternatively, UV-ray irradiation section 57 may be made movable so as to be positioned above wafer (W) only when it performs a vaporization acceleration process.

A first processing apparatus may also have a current-forming unit or a decompression device as a vaporization acceleration device the same as second processing apparatus 6. Alternatively, a first processing apparatus may be equipped with a nozzle to supply high-temperature N2 gas from above wafer (W) to the main surface of wafer (W). Yet alternatively, a heating portion such as a heater may be positioned above wafer (W).

Fifth Embodiment

Figure 13:
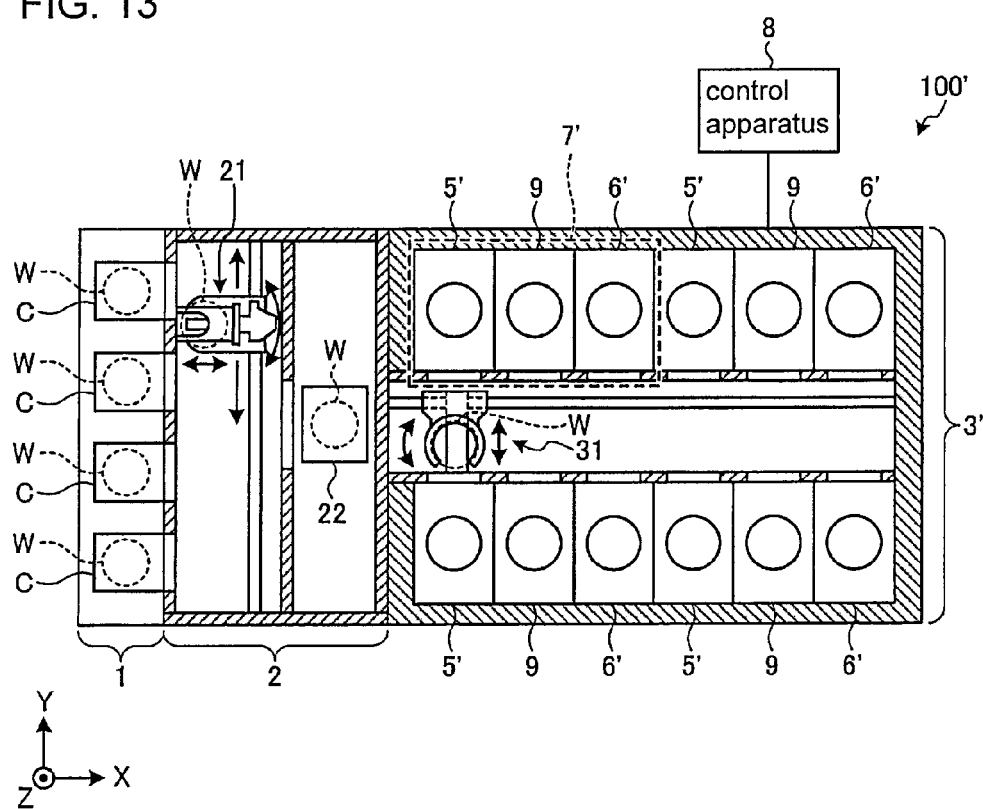
FIG. 13 is a view schematically showing the structure of a substrate cleaning system according to a fifth embodiment.

In each embodiment described above, a vaporization acceleration process is set to be conducted either in a first processing apparatus or a second processing apparatus. However, a substrate cleaning apparatus may further be equipped with a vaporization acceleration unit. Such an example is described by referring to FIG. 13. FIG. 13 is a view schematically showing the structure of a substrate cleaning system according to a fifth embodiment.

As shown in FIG. 13, substrate cleaning system (100') according to the fifth embodiment has processing station (3') instead of processing station 3 (see FIG. 1). Instead of substrate cleaning apparatus 7, substrate cleaning apparatus (7') is provided in processing station (3'). The rest of the structure is the same as that of substrate cleaning system 100.

Substrate cleaning apparatus (7') has three processing units: first processing apparatus (5'), second processing apparatus (6') and third processing apparatus 9.

First processing apparatus (5'), second processing apparatus (6') and third processing apparatus 9 are set in position from the front toward the rear of substrate cleaning system (100') in the order of first processing apparatus (5'), third processing apparatus 9 and second processing apparatus (6'). However, first processing apparatus (5'), second processing apparatus (6') and third processing apparatus 9 are not limited to being positioned as shown in the drawing.

First processing apparatus (5') has the same structure as first processing apparatus 5 of the first embodiment. Also, second processing apparatus (6') has the same structure as second processing apparatus 6 of the first embodiment except that the structure for a vaporization acceleration process (N2 gas supply source 118, valve 128, current-forming unit 65, decompression device 66, and so forth) is excluded.

Third processing apparatus 9 is a processing unit for vaporization acceleration. An example of the structure of third processing apparatus 9 is described by referring to FIG. 14. FIG. 14 is a view schematically showing the structure of third processing apparatus 9.

As shown in FIG. 14, third processing apparatus 9 has base table 92 and hotplate 93 in third chamber 91. Base table 92 is positioned at the bottom of third chamber 91 and supports hotplate 93 at a predetermined height.

Heating portion 931 is provided inside hotplate 93. Support pin 932 to support wafer (W) is provided above heating portion 931.

In substrate cleaning apparatus (7') of the fifth embodiment, after a first unloading process shown in step (S 106) of FIG. 5, wafer (W) is loaded into third processing apparatus 9 by substrate transfer device 31 and placed on support pin 932 above hotplate 93. Then, hotplate 93 heats wafer (W) in third processing apparatus 9. Accordingly, the topcoat solution is heated along with wafer (W), thus vaporization of the volatile component is accelerated.

As described above, a substrate cleaning apparatus may be structured to have a first processing apparatus to conduct a film-forming treatment solution supply process, a second processing apparatus to conduct a removal-solution supply process, and a third processing apparatus to conduct a vaporization acceleration process.

The structure of third processing apparatus 9 is not limited to that shown in FIG. 14. For example, it is an option for third processing apparatus 9 to have a substrate holding device the same as second substrate holding device 62 of second processing apparatus 6, and to heat wafer (W) by supplying high-temperature N2 gas to the lower surface of wafer (W) from the gas supply device. Alternatively, third processing apparatus 9 may have a current-forming unit, a decompression device, a UV-ray irradiation device or the like as a vaporization acceleration device.

In each embodiment above, chemical solution treatment and a film-forming treatment solution supply process are set to be conducted in a first processing apparatus. However, chemical solution treatment may be conducted in another unit independent of the first processing apparatus. Alternatively, chemical solution treatment may be conducted in a second processing apparatus. In such an example, solution supply device 53 or the like may be provided in the second processing apparatus.

In each embodiment above, a topcoat solution and an alkaline developing solution are set to be supplied to the main surface of wafer (W). However, in a first processing apparatus and second processing apparatus, a topcoat solution and an alkaline developing solution may be supplied onto both surfaces of wafer (W). In such an example, a mechanical chuck such as second substrate holding device 62 is provided to each of a first processing apparatus and a second processing apparatus, and a topcoat solution and an alkaline developing solution may be supplied from a flowing-substance supply portion.

By providing an under plate to cover the lower surface of wafer (W), space between wafer (W) and the under plate is filled with a topcoat solution or an alkaline developing solution, and the topcoat solution or the alkaline developing solution is spread efficiently over the lower surface of wafer (W). Also, when an under plate is provided in first processing apparatus 5, a heating portion is formed in the under plate to conduct a vaporization acceleration process using the heating portion.

Other Embodiments

In each of the above embodiments, a topcoat solution has been used as a film-forming treatment solution. However, a film-forming treatment solution is not limited to a topcoat solution.

The film-forming treatment solution may also be a treatment solution containing phenolic resin. Since phenolic resin also causes curing contraction the same as acrylic resin described above, it is effective to provide tensile force to particles the same as topcoat solutions.

An example of a film-forming treatment solution containing phenolic resin is a resist solution. Resist solutions are film-forming treatment solutions to form resist film on wafer (W). In particular, novolac-based phenolic resin is contained in a resist solution.

When a resist solution is used for a film-forming treatment solution, a thinner that dissolves the resist solution may be used as a removal solution. When a thinner is used as a removal solution, a rinsing process after the removal-solution supply process may be omitted. Also, when a resist solution is used as a film-forming treatment solution, it is an option to supply a removal solution after an exposure-to-light process such as whole image exposure is performed on the resist film formed on wafer (W). In such an example, either a developing solution or a thinner may be selected as a removal solution.

A synthetic resin contained in a film-forming treatment solution is not limited to acrylic resin or phenolic resin described above, and it may be any type as long as it causes curing contraction. Examples of synthetic resin contained in a film-forming treatment solution are as follows: epoxy resin, melanin resin, urea resin, unsaturated polyester resin, alkyd resin, polyurethane, polyimide, polyethylene, polypropylene, polyvinylidene chloride, polystyrene, polyvinyl acetate, polytetrafluoroethylene, acrylonitrile butadiene styrene resin, styrene acrylonitrile resin, polyamide, nylon, polyacetal, polycarbonate, denatured polyphenylene ether, polybutylene terephthalate, polyethylene terephthalate, polyphenylene sulfide, polysulfone, polyether ether ketone and polyamideimide.

As for a film-forming treatment solution, an antireflective film solution may also be used. An antireflective film solution is for forming antireflective film on wafer (W). Antireflective film is protective film to reduce reflection on the main surface of wafer (W) and to increase permeability. When such an antireflective film solution is used as a film-forming treatment solution, DIW that dissolves the antireflective film solution may be used as a removal solution.

In addition to a volatile component and synthetic resin, a film-forming treatment solution may further contain a predetermined chemical solution to dissolve wafer (W) or the material formed on wafer (W) or foreign substances attached to wafer (W). Here, "material formed on wafer (W)" means base film on wafer (W), for example. "Foreign substances attached to wafer (W)" are, for example, particles of metallic contaminants. Also, a "predetermined chemical solution" is, for example, hydrogen fluoride, ammonium fluoride, hydrochloric acid, sulfuric acid, hydrogen peroxide solution, phosphoric acid, acetic acid, nitric acid, ammonium hydroxide or the like. When surfaces of base film and particles are dissolved by such chemical solutions, the adhesive force of the particles is lowered. Thus, the particles are more likely to be removed.

Compared with chemical solutions in a conventional chemical cleaning process that uses chemical reactions, a "predetermined chemical solution" here is used under such conditions that reduce the amount of etching. Thus, compared with conventional chemical solution cleaning, erosion of base film is suppressed and particles are removed more effectively.

In each of the embodiments above, an alkaline developing solution has been used as a removal solution. However, a hydrogen peroxide solution may be added to the alkaline developing solution. When a hydrogen peroxide solution is added to an alkaline developing solution, wafer surfaces may be suppressed from being roughened by the alkaline developing solution.

A removal solution may be organic solvents such as thinner, toluene, acetates, alcohols, glycols (propylene glycol monomethyl ether) or the like, or it may be an acidic developing solution such as acetic acid, formic acid, hydroxyacetic acid or the like.

A removal solution may further contain a surfactant. Since a surfactant works to reduce surface tension, it can suppress particles from reattaching to wafer (W) or the like.

In each embodiment above, an example has been described where first processing apparatus 5 and second processing apparatus 6 are accommodated in different chambers (first chamber 51 and second chamber 61). However, first processing apparatus 5 and second processing apparatus 6 may be accommodated in one chamber.

In each of the above embodiments, wafer (W) is set to be rotated by a substrate holding device that holds wafer (W) while allowing wafer (W) to rotate so that a treatment solution such as a topcoat solution is spread over wafer (W) due to centrifugal force caused by rotation of wafer (W). However, that is not the only option. For example, using a slit nozzle, a treatment solution may be spread over wafer (W) without rotating wafer (W). In such an example, the substrate holding device does not need a rotation mechanism.

When a method is used for removing particles by physical force, there are concerns that patterns formed on the main surface of a substrate may collapse due to physical force.

When a method is used for removing particles by chemical reactions of a chemical solution, there are concerns that the base film of a substrate may be eroded by etching or the like.

Using a substrate cleaning system, substrate cleaning method and memory medium according to an embodiment of the present invention, particles attached to a substrate are removed, and pattern collapse or base film erosion is suppressed.

A substrate cleaning system according to an embodiment of the present invention has a first processing apparatus and a second processing apparatus. The first processing apparatus has a first holding device to hold a substrate, and a first supply device to supply a treatment solution that contains a volatile component and forms film on the entire main surface of the substrate. The second processing apparatus has a second holding device to hold a substrate, and a second supply device to supply a removal solution that dissolves the entire film formed on the substrate when the treatment solution supplied to the substrate from the first supply device solidifies or cures on the substrate through vaporization of the volatile component.

According to an embodiment of the present invention, particles attached to a substrate are removed, and pattern collapse or base film erosion is suppressed. In addition, since different holding devices are used to supply a treatment solution to a substrate and to supply a removal solution to the substrate, the treatment solution is prevented from attaching to the second holding device that holds the substrate when the removal solution is supplied.

Obviously, numerous modifications and variations of the present invention are possible in light of the above teachings. It is therefore to be understood that within the scope of the appended claims, the invention may be practiced otherwise than as specifically described herein.

What is claimed is:

1. A substrate cleaning system, comprising:
    a first processing apparatus comprising a first holding device configured to hold a substrate having circuit patterns formed on a front surface, and a treatment solution supply device configured to supply onto the front surface of the substrate a treatment solution which includes a volatile component and solidifies or is cured to form a treatment film;
    a second processing apparatus comprising a second holding device configured to hold the substrate, and a removal-solution supply device configured to supply onto the substrate a removal solution which removes the treatment film formed on the front surface of the substrate after the treatment solution supplied by the treatment solution supply device solidifies or is cured; and
    a control device comprising circuitry configured to control the first holding device to hold the substrate having circuit patterns after a resist film for the circuit patterns is removed from the front surface of the substrate, control the treatment solution supply device to supply the treatment solution onto the circuit patterns such that the treatment solution entirely coats the circuit patterns and entirely covers the front surface of the substrate held by the first holding device, control the second holding device to hold the substrate having the treatment film entirely covering the circuit patterns, and control the removal-solution supply device to supply the removal solution onto the substrate having the treatment film while being held by the second holding device,
    wherein the second holding device includes a first holder comprising a plurality of first holder portions configured to hold the periphery of the substrate and a second holder comprising a plurality of second holder portions configured to hold the periphery of the substrate independently of the first holder, and the circuitry of the control device is configured to control the second holding device such that the second holding device switches from the first holder to the second holder by moving away the plurality of first holder portions from the substrate in a horizontal direction after the plurality of second holder portions moves close to the substrate in the horizontal direction.

2. The substrate cleaning system according to claim 1, further comprising:
    a substrate transfer device configured to transfer the substrate from the first holding device in the first processing apparatus to the second holding device in the second processing apparatus; and
    a back-surface cleaning device configured to supply a cleaning solution to a center portion of a back surface of the substrate held by the second holding device,
    wherein the first holding device is a suction-holding device configured to suction-hold the substrate, and the second holding device is a holder device configured to hold the periphery of the substrate.

3. The substrate cleaning system according to claim 1, wherein the first holding device is a suction-holding device configured to suction-hold the substrate, and the second holding device is a holder device configured to hold the periphery of the substrate.

4. The substrate cleaning system according to claim 2, wherein the circuitry of the control device is configured to control the first processing apparatus and the second processing apparatus such that the back-surface cleaning device cleans the back surface of the substrate while the front surface of the substrate is entirely covered with the treatment film.

5. The substrate cleaning system according to claim 3, wherein the second processing apparatus comprises a second removal-solution supply device configured to supply the removal solution to the holder device.

6. The substrate cleaning system according to claim 1, further comprising:
    a substrate transfer device configured to transfer the substrate from the first holding device in the first processing apparatus to the second holding device in the second processing apparatus,
    wherein the second processing apparatus comprises a vaporization acceleration device configured to accelerate vaporization of the volatile component in the treatment solution, and the circuitry of the control device is configured to control the vaporization acceleration device to accelerate the vaporization of the volatile component in the treatment solution in the second processing apparatus and control the removal-solution supply device to supply the removal solution onto the substrate after the vaporization of the volatile component by the vaporization acceleration device.

7. The substrate cleaning system according to claim 1, further comprising:
    a third processing apparatus comprising a vaporization acceleration device configured to accelerate vaporization of the volatile component in the treatment solution.

8. The substrate cleaning system according to claim 1, further comprising:
    a first chamber accommodating the first processing apparatus; and
    a second chamber accommodating the second processing apparatus.

9. The substrate cleaning system according to claim 1, wherein the first processing apparatus includes a chemical solution supply device configured to supply a chemical solution to the substrate, and a pure water supply device configured to supply pure water to the substrate.

10. The substrate cleaning system according to claim 1, wherein the first processing apparatus includes a solvent supply device configured to supply to the substrate a solvent having affinity property with the treatment solution.

11. The substrate cleaning system according to claim 6, wherein the vaporization acceleration device is configured to supply a high-temperature $N_2$ gas to a back surface of the substrate held by the second holding device.

12. The substrate cleaning system according to claim 1, wherein the circuitry of the control device is configured to control the second holding device such that the second holding device switches from the first holder to the second holder while the removal-solution supply device is supplying the removal solution onto the substrate held by the second holding device.

* * * * *